(12) United States Patent
Kasibhotla et al.

(10) Patent No.: US 12,147,212 B2
(45) Date of Patent: Nov. 19, 2024

(54) DIAGNOSTIC METHODS FOR SUBSTRATE MANUFACTURING CHAMBERS USING PHYSICS-BASED MODELS

(71) Applicant: Applied Materials, Inc., Santa Clara, CA (US)

(72) Inventors: Venkata Ravishankar Kasibhotla, Bengaluru (IN); Tao Zhang, San Ramon, CA (US); Xiaoqun Zou, Danville, CA (US); Bala Shyamala Balaji, Bengaluru (IN)

(73) Assignee: Applied Materials, Inc., Santa Clara, CA (US)

( * ) Notice: Subject to any disclaimer, the term of this patent is extended or adjusted under 35 U.S.C. 154(b) by 309 days.

(21) Appl. No.: 17/558,507

(22) Filed: Dec. 21, 2021

(65) Prior Publication Data
US 2023/0195074 A1    Jun. 22, 2023

(51) Int. Cl.
G05B 19/404    (2006.01)
G06N 20/00    (2019.01)

(52) U.S. Cl.
CPC ........... *G05B 19/404* (2013.01); *G06N 20/00* (2019.01); *G05B 2219/37506* (2013.01)

(58) Field of Classification Search
CPC ........ G05B 19/404; G05B 2219/37506; G06N 20/00; G06N 3/084; H02H 3/006; H01L 21/67115
See application file for complete search history.

(56) References Cited

U.S. PATENT DOCUMENTS

| | | | |
|---|---|---|---|
| 11,383,965 B1* | 7/2022 | Springer | B67D 1/0037 |
| 2009/0222220 A1* | 9/2009 | Wilke | F16K 37/0091 |
| | | | 702/41 |
| 2018/0082826 A1* | 3/2018 | Guha | H01J 37/32082 |
| 2018/0341248 A1* | 11/2018 | Mehr | G05B 13/048 |
| 2019/0146000 A1 | 5/2019 | Hurst et al. | |
| 2019/0147412 A1* | 5/2019 | Chiaramonte | G06Q 10/20 |
| | | | 705/7.13 |
| 2020/0226742 A1* | 7/2020 | Sawlani | H01L 21/67288 |
| 2020/0333774 A1 | 10/2020 | Banna | |
| 2021/0175104 A1 | 6/2021 | Banna et al. | |
| 2022/0034753 A1* | 2/2022 | Liebman | F02D 13/0203 |
| 2022/0083083 A1* | 3/2022 | Allmaras | E03B 1/02 |

FOREIGN PATENT DOCUMENTS

JP    2012532462 A    12/2012

OTHER PUBLICATIONS

International Search Report and Written Opinion for International Application No. PCT/US2022/052447, mailed Apr. 21, 2023, 10 Pages.

* cited by examiner

*Primary Examiner* — Nicholas Klicos
(74) *Attorney, Agent, or Firm* — Lowenstein Sandler LLP

(57) ABSTRACT

A method includes receiving first sensor data, generated during a manufacturing process by sensors associated with a substrate manufacturing chamber. The method further includes receiving simulated sensor data generated by a trained physics-based model. The method further includes determining which one or more components of the manufacturing chamber contribute to a difference between the first sensor data and the simulated sensor data. The method further includes causing performance of a corrective action in view of the difference.

20 Claims, 6 Drawing Sheets

DIAGNOSTIC METHODS FOR SUBSTRATE MANUFACTURING CHAMBERS USING PHYSICS-BASED MODELS

TECHNICAL FIELD

The present disclosure relates to diagnostic methods for determining faults in manufacturing equipment, and more particularly, using physics-based models to aid in diagnostic methods.

BACKGROUND

Products may be produced by performing one or more manufacturing processes using manufacturing equipment. For example, semiconductor manufacturing equipment may be used to produce substrates via semiconductor manufacturing processes. Products are to be produced with particular properties, suited for a target application. Understanding and controlling properties within the manufacturing chamber aids in consistent production of products.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular embodiments of the disclosure or any scope of the claims. Its sole purpose is to present some concepts of the disclosure in a simplified form as a prelude to the more detailed description that is presented later.

In an aspect of the disclosure, a method includes receiving first sensor data, generated during a manufacturing process by sensors associated with a substrate manufacturing chamber. The method further includes receiving simulated sensor data generated by a trained physics-based model. The method further includes determining which one or more components of the manufacturing chamber contribute to a difference between the first sensor data and the simulated sensor data. The method further includes causing performance of a corrective action in view of the difference.

In another aspect of the disclosure, a method includes receiving sensor data generated during a manufacturing process by sensors associated with substrate manufacturing equipment. The method further includes receiving simulated sensor data generated by a physics-based model. The method further includes determining at least one difference between the measured sensor data and the simulated sensor data. The method further includes training the physics-based model by adjusting parameters associated with the physics-based model until the at least one difference between the sensor data and simulated sensor data is less than a threshold value.

In another aspect of the disclosure, a non-transitory computer-readable storage medium stores instructions that, when executed by a processing device, cause the processing device to perform operations. The operations include receiving first sensor data generated during a manufacturing process by sensors associated with a substrate manufacturing chamber. The operations further include receiving simulated sensor data generated by a trained physics-based model. The operations further include determining which one or more components of the manufacturing chamber contribute to a difference between the first sensor data and the simulated sensor data. The operations further include causing performance of a corrective action in view of the difference.

BRIEF DESCRIPTION OF THE DRAWINGS

The present disclosure is illustrated by way of example, and not by way of limitation in the figures of the accompanying drawings.

DETAILED DESCRIPTION

Figure 1:
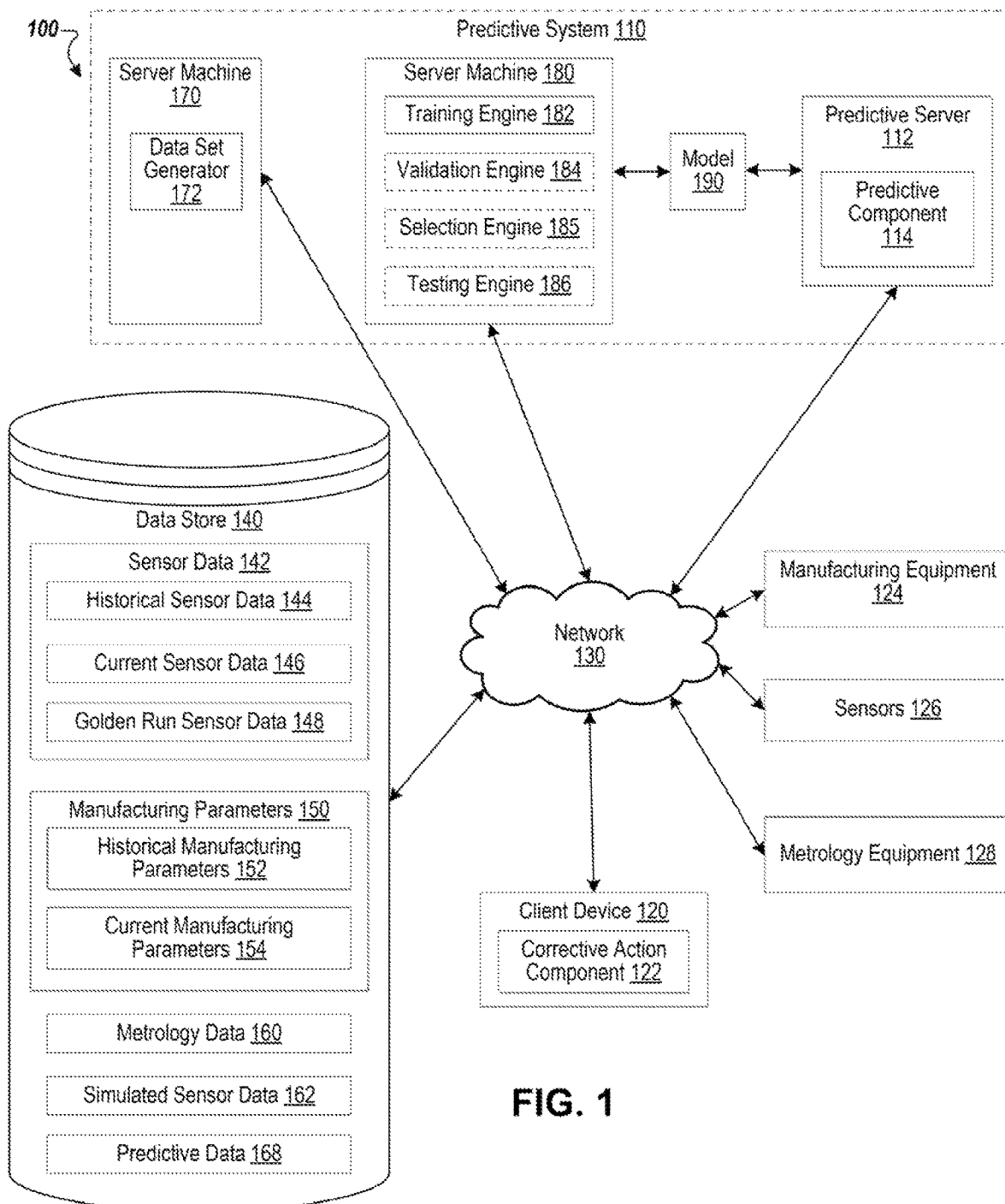
FIG. 1 is a block diagram illustrating an exemplary system architecture, according to certain embodiments.

Described herein are technologies related to digital twin based diagnostic methods for diagnosing problems in manufacturing equipment. Manufacturing equipment may be used to produce products, such as substrates (e.g., wafers, semiconductors). Manufacturing equipment often includes a manufacturing chamber that separates the substrate being processed from the environment. The properties of the produced substrates are expected to meet target property values in order to facilitate specific functionalities. Manufacturing parameters are to be selected to attempt to produce substrates that meet target property values. There are many manufacturing parameters (e.g., hardware parameters, process parameters, etc.) that contribute to the properties of the resulting substrates. Manufacturing systems control such parameters by specifying a set point for a property value and receiving data from sensors disposed within the manufacturing chamber, making adjustments to the manufacturing equipment until the sensor readings match the set point. In some cases, a sensor and a controller of some component of manufacturing equipment are in a closed control loop, which is to say the manufacturing equipment is automatically adjusted when a difference between a sensor-measured property value and a set point is detected.

Such closed control loops can become corrupted, for instance due to sensor drift, chamber drift, component aging or failure, etc. In conventional systems, such corruption may be detected as properties of produced substrates change as manufacturing equipment continues to be used. Measuring the properties of substrates (e.g., collecting metrology data) can be time consuming, can use costly equipment, costs energy, and introduces a delay between control loop or chamber malfunction and detection of the malfunction, followed by a delay between detection and diagnosis, and another delay between diagnosis and correction. Such delays may introduce or increase unplanned downtime of manufacturing equipment, or may cause the production of one or more faulty substrates while problems are being detected, resulting in wasted materials, energy, etc.

Errors in manufactured substrates may be attributable to one or many of a large list of possible causes. Diagnosing the particular cause of substrate faults can be expensive. In conventional systems, determining the cause of a substrate fault may be done empirically (e.g., adjusting parameters without definite knowledge that the parameter adjustments will result in improved conditions in the manufacturing chamber). Substrates are then produced, metrology performed, quality evaluated, and parameters adjusted again until produced substrates reach an acceptable level of quality. Not only is the process of achieving acceptable substrates expensive, but an adjusted recipe may not be efficient (e.g., if the drifting performance in the chamber was due to drifting heater performance, but processing time was the parameter changed to achieve acceptable performance). In such a case, not only is the process of discovering the cause of problematic substrate production wasteful, but each subsequent manufacturing run may be more expensive in terms of energy, materials, time, or the like than operating at ideal manufacturing conditions would allow.

Such an approach may shorten the lifetime of some manufacturing components. Components may be operated in conditions that they are not ideally suited for. Over time, such operation may cause components to prematurely break down, which may in turn cause unscheduled downtime of the manufacturing equipment to replace the components.

The methods and devices of the present disclosure address at least one or more of these deficiencies of conventional solutions. In some embodiments, a manufacturing chamber is modeled using a physics-based digital twin model. In some embodiments, a hybrid methodology is used with gas dynamics in a chamber modeled using physics-based correlations and data-driven techniques to calibrate the model for chamber to chamber matching.

A model of a chamber can be built corresponding to solving equations of physics (heat transfer, fluid dynamics, etc.) relevant to operations in the manufacturing chamber. The physics-based model may incorporate digital sensors that provide simulated readings corresponding to the readings provided by physical sensors in the manufacturing chamber. A physics-based model constructed in this way is likely to still be somewhat inaccurate, due to calculation error, manufacturing tolerances of the equipment, aging/drift of the equipment, etc. Such a physics-based model may be trained by providing input data (e.g., manufacturing parameters) and sensor data from the manufacturing chamber that corresponds to the physics-based digital twin model. The model may then use the input data to attempt to recreate the provided sensor data. If the simulated sensor data is different than the chamber sensor data, processing logic may adjust some parameters of the model to bring the model into closer alignment with the data provided from the manufacturing chamber. This process may be repeated until the physics-based model is capable of sufficiently replicating sensor data in the manufacturing chamber.

After training the physics-based digital twin model, input data (e.g., manufacturing parameters) from subsequent manufacturing runs may be input into the physics-based model. Output from the physics-based model (e.g., simulated sensor data) may then be compared to sensor data collected from the manufacturing chamber during manufacturing runs. If the differences between the simulated sensor data and the measured sensor data are insignificant (e.g., within a threshold value of zero), the components of the manufacturing chamber may be considered to be in working condition. If the differences between the simulated sensor data and the measured sensor data are significant, components of the manufacturing chamber may be considered to be faulty, damaged, or the like. Further investigation may then be initiated to isolate the components contributing to the degradation of the chamber. A corrective action may be taken to return the manufacturing chamber to a previous condition.

In some embodiments, aspects of this disclosure may be performed online, which is to say in parallel with the substrate manufacturing process. While metrology data can be time consuming to work into updating process parameters, methods disclosed herein may be performed during substrate manufacturing. Processing time to obtain predictive or corrective data may take a few seconds — in the time it takes to move a finished substrate out of the manufacturing chamber and begin work on a new substrate, process methods may be adjusted and the next substrate may be processed in ideal conditions. In some embodiments, adjustments may be made during a manufacturing process to further reduce waste.

In some embodiments, sensor data from a manufacturing run which produced acceptable substrates may also be stored. Additional data indicative of a successful run is then available to compare to current sensor data. In some embodiments, data not well-represented by the physics based model may be captured by the "golden run" data, i.e. a run which produced an acceptable product, for instance, radio frequency (RF) match data.

In some embodiments, output from the physics-based model and sensor data from the manufacturing chamber may be provided as input to a trained machine learning model. The trained machine learning model may provide as output a list of components and that contribute to a difference between simulated and measured sensor data. The trained machine learning model may also provide data indicating to what degree each component contributes. In some embodiments, the trained machine learning model may be provided with sensor data from a golden run. The trained machine learning model may use the golden run data and the current sensor data, in some embodiments along with simulated sensor data, to provide output indicative of component contributions to differences between golden run data, measured sensor data, and simulated sensor data.

Aspects of the present disclosure result in technological advantages compared to conventional solutions. The present disclosure results in a more efficient substrate manufacturing process with minimized waste. If a problem arises in a manufacturing chamber, methods of the present disclosure may be able to cause performance of a corrective action before processing of the next wafer has begun. In this way, wasted material, manufacturing chamber time, and energy supplied to the manufacturing process can be minimized. Product quality may increase, as root causes of variations in wafer quality and chamber drift may be identified and corrected. The efficiency of producing wafers of acceptable quality may also increase, as the process parameters can be tuned more precisely, improving cost of materials, energy, and time. Aging components may be identified and flagged for replacement or maintenance, reducing unscheduled down time, costs associated with express shipping replacement parts, and the like.

In some embodiments, the present disclosure describes a method including receiving measured sensor data, generated by sensors associated with a substrate manufacturing chamber during a manufacturing process. The method further includes receiving simulated sensor data generated by a trained physics-based model. The method further includes determining which component or components of the manufacturing equipment are contributing to a difference between the measured sensor data and the simulated sensor data. The method further includes causing performance of a corrective action in view of the difference.

In some embodiments, the present disclosure describes a method of training a physics-based digital twin model, including receiving sensor data generated by sensors associated with substrate manufacturing equipment during a manufacturing process. The method further includes receiving simulated sensor data generated by a (untrained) physics-based model. The method further includes determining at least one difference between the sensor data and the simulated sensor data. The method further includes training the physics-based model by adjusting parameters of the physics-based model until the differences between the simulated sensor data and the measured sensor data is effectively zero (e.g., less than a threshold value from zero).

In some embodiments, the present disclosure describes a non-transitory computer-readable storage medium storing instruction. When executed by a processing device, the instructions cause the processing device to perform operations. The operations include receiving sensor data generated by sensors associated with a substrate manufacturing chamber during a manufacturing process. The operations further include receiving simulated sensor data generated by a trained physics-based model. The operations further include determining which component or components of the manufacturing chamber are contributing to at least one difference between the simulated sensor data and the measured sensor data. The operations further include causing the performance of a corrective action in view of the difference.

FIG. 1 is a block diagram illustrating an exemplary system 100 (exemplary system architecture), according to certain embodiments. The system 100 includes a client device 120, manufacturing equipment 124, sensors 126, metrology equipment 128, a predictive server 112, and a data store 140. The predictive server 112 may be part of a predictive system 110. The predictive system 110 may further include server machines 170 and 180.

The sensors 126 may provide sensor data 142 associated with manufacturing equipment 124 (e.g., associated with producing, by manufacturing equipment 124, corresponding products, such as substrates). The sensor data 142 may be used for equipment health and/or product health (e.g., product quality). The manufacturing equipment 124 may produce products following a recipe or performing runs over a period of time. In some embodiments, the sensor data 142 may include values of one or more of temperature (e.g., heater temperature), spacing (SP), pressure, High Frequency Radio Frequency (HFRF), radio frequency (RF) match voltage, RF match current, RF match capacitor position, voltage of Electrostatic Chuck (ESC), actuator position, electrical current, flow, power, voltage, etc. Sensor data 142 may be associated with or indicative of manufacturing parameters such as hardware parameters (e.g., settings or components, e.g., size, type, etc.) of manufacturing equipment 124 or process parameters of manufacturing equipment 124. Data associated with some hardware parameters may, instead or additionally, be stored as manufacturing parameters 150, which may include historical manufacturing parameters 152 and current manufacturing parameters 154. Manufacturing parameters 150 may be indicative of input settings to the manufacturing device (e.g., heater power, gas flow, etc.). The sensor data 142 and/or manufacturing parameters 150 may be provided while the manufacturing equipment 124 is performing manufacturing processes (e.g., equipment readings when processing products). The sensor data 142 may be different for each product (e.g., each substrate). Substrates may have property values (film thickness, film strain, etc.) measured by metrology equipment 128. Metrology data 160 may be a component of data store 140.

In some embodiments, sensor data 142, metrology data 164, or manufacturing parameters 150 may be processed (e.g., by the client device 120 and/or by the predictive server 112). Processing of the sensor data 142 may include generating features. In some embodiments, the features are a pattern in the sensor data 142, metrology data 160, and/or manufacturing parameters 150 (e.g., slope, width, height, peak, etc.) or a combination of values from the sensor data 142, metrology data, and/or manufacturing parameters (e.g., power derived from voltage and current, etc.). The sensor data 142 may include features and the features may be used by the predictive component 114 for performing signal processing and/or for obtaining predictive data 168 for performance of a corrective action.

Each instance (e.g., set) of sensor data 142 may correspond to a product (e.g., a substrate), a set of manufacturing equipment, a type of substrate produced by manufacturing equipment, or the like. Each instance of metrology data 160 and manufacturing parameters 150 may likewise correspond to a product, a set of manufacturing equipment, a type of substrate produced by manufacturing equipment, or the like. The data store may further store information associating sets of different data types, e.g. information indicative that a set of sensor data, a set of metrology data, and a set of manufacturing parameters are all associated with the same product, manufacturing equipment, type of substrate, etc.

In some embodiments, a physics-based digital twin model may produce simulated sensor data 162. Simulated sensor data 162 may be processed in any of the ways described above in connection with sensor data 142, e.g., generating features, combining values, linking data from a particular recipe, chamber, or substrate, etc.

In some embodiments, predictive system 110 may generate predictive data 168 using supervised machine learning (e.g., supervised data set, predictive data 168 includes metrology data, etc.). In some embodiments, predictive system 110 may generate predictive data 168 using semi-supervised learning (e.g., semi-supervised data set, predictive data 168 is a predictive percentage, etc.). In some embodiments, predictive system 110 may generate predictive data 168 using unsupervised machine learning (e.g., unsupervised data set, clustering, clustering based on metrology data 160, etc.).

Client device 120, manufacturing equipment 124, sensors 126, metrology equipment 128, predictive server 112, data store 140, server machine 170, and server machine 180 may be coupled to each other via network 130 for generating predictive data 168 to perform corrective actions.

In some embodiments, network 130 is a public network that provides client device 120 with access to the predictive server 112, data store 140, and other publicly available computing devices. In some embodiments, network 130 is a private network that provides client device 120 access to manufacturing equipment 124, sensors 126, metrology equipment 128, data store 140, and other privately available computing devices. Network 130 may include one or more Wide Area Networks (WANs), Local Area Networks (LANs), wired networks (e.g., Ethernet network), wireless networks (e.g., an 802.11 network or a Wi-Fi network), cellular networks (e.g., a Long Term Evolution (LTE) network), routers, hubs, switches, server computers, cloud computing networks, and/or a combination thereof.

The client device 120 may include a computing device such as Personal Computers (PCs), laptops, mobile phones, smart phones, tablet computers, netbook computers, network connected televisions ("smart TV"), network-connected media players (e.g., Blu-ray player), a set-top-box, Over-the-Top (OTT) streaming devices, operator boxes, etc. The client device 120 may include a corrective action component 122. Corrective action component 122 may receive user input (e.g., via a Graphical User Interface (GUI) displayed via the client device 120) of an indication associated with manufacturing equipment 124. In some embodiments, the corrective action component 122 transmits the indication to the predictive system 110, receives output (e.g., predictive data 168) from the predictive system 110, determines a corrective action based on the output, and causes the corrective action to be implemented. In some embodiments, the corrective action component 122 obtains sensor data 142 (e.g., current sensor data 146) associated with the manufacturing equipment 124 (e.g., from data store 140, etc.) and provides the sensor data 142 (e.g., current sensor data 146) associated with the manufacturing equipment 124 to the predictive system 110. In some embodiments, the corrective action component 122 stores sensor data 142 in the data store 140 and the predictive server 112 retrieves the sensor data 142 from the data store 140. In some embodiments, predictive server 112 may store output (e.g., predictive data 168) of the trained model(s) 190 in the data store 140 and the client device 120 may retrieve the output from the data store 140. In some embodiments, the corrective action component 122 receives an indication of a corrective action from the predictive system 110 and causes the corrective action to be implemented. Each client device 120 may include an operating system that allows users to one or more of generate, view, or edit data (e.g., indication associated with manufacturing equipment 124, corrective actions associated with manufacturing equipment 124, etc.).

In some embodiments, metrology data 160 corresponds to historical property data of products (e.g., produced using manufacturing parameters associated with historical sensor data 144 and historical manufacturing parameters 152) and the predictive data 168 is associated with predicted property data (e.g., of products to be produced or that have been produced in conditions recorded by current sensor data 146 and/or current manufacturing parameters 154). In some embodiments, the predictive data 168 is predicted metrology data (e.g., virtual metrology data) of the products to be produced or that have been produced according to conditions recorded as current sensor data 146 and/or current manufacturing parameters 154. In some embodiments, the predictive data 168 is an indication of abnormalities (e.g., abnormal products, abnormal components, abnormal manufacturing equipment 124, abnormal energy usage, etc.) and one or more causes of the abnormalities. In some embodiments, the predictive data 168 is an indication of change over time or drift in some component of manufacturing equipment 124, sensors 126, metrology equipment 128, and the like. In some embodiments, predictive data 168 is an indication of an end of life of a component of manufacturing equipment 124, sensors 126, metrology equipment 128, or the like.

Performing manufacturing processes that result in defective products can be costly in time, energy, products, components, manufacturing equipment 124, the cost of identifying the defects and discarding the defective product, etc. By inputting sensor data 142 (e.g., manufacturing parameters that are being used or are to be used to manufacture a product) into predictive system 110, receiving output of predictive data 168, and performing a corrective action based on the predictive data 168, system 100 can have the technical advantage of avoiding the cost of producing, identifying, and discarding defective products.

Performing manufacturing processes that result in failure of the components of the manufacturing equipment 124 can be costly in downtime, damage to products, damage to equipment, express ordering replacement components, etc. By inputting sensor data 142 (e.g., manufacturing parameters that are being used or are to be used to manufacture a product), receiving output of predictive data 168, and performing corrective action (e.g., predicted operational maintenance, such as replacement, processing, cleaning, etc. of components) based on the predictive data 168, system 100 can have the technical advantage of avoiding the cost of one or more of unexpected component failure, unscheduled downtime, productivity loss, unexpected equipment failure, product scrap, or the like. Monitoring the performance over time of components, e.g. manufacturing equipment 124, sensors 126, metrology equipment 128, and the like, may provide indications of degrading components.

Manufacturing parameters may be suboptimal for producing product which may have costly results of increased resource (e.g., energy, coolant, gases, etc.) consumption, increased amount of time to produce the products, increased component failure, increased amounts of defective products, etc. By inputting the sensor data 142 into the trained model 190, receiving an output of predictive data 168, and performing (e.g., based on the predictive data 168) a corrective action of updating manufacturing parameters (e.g., setting optimal manufacturing parameters), system 100 can have the technical advantage of using optimal manufacturing parameters (e.g., hardware parameters, process parameters, optimal design) to avoid costly results of suboptimal manufacturing parameters.

Corrective action may be associated with one or more of Computational Process Control (CPC), Statistical Process Control (SPC) (e.g., SPC on electronic components to determine process in control, SPC to predict useful lifespan of components, SPC to compare to a graph of 3-sigma, etc.), Advanced Process Control (APC), model-based process control, preventative operative maintenance, design optimization, updating of manufacturing parameters, updating manufacturing recipes, feedback control, machine learning modification, or the like.

In some embodiments, the corrective action includes providing an alert (e.g., an alarm to stop or not perform the manufacturing process if the predictive data 168 indicates a predicted abnormality, such as an abnormality of the product, a component, or manufacturing equipment 124). In some embodiments, the corrective action includes providing feedback control (e.g., modifying a manufacturing parameter responsive to the predictive data 168 indicating a predicted abnormality). In some embodiments, performance of the corrective action includes causing updates to one or more manufacturing parameters.

Manufacturing parameters may include hardware parameters (e.g., replacing components, using certain components, replacing a processing chip, updating firmware, etc.) and/or process parameters (e.g., temperature, pressure, flow, rate, electrical current, voltage, gas flow, lift speed, etc.). In some embodiments, the corrective action includes causing preventative operative maintenance (e.g., replace, process, clean, etc. components of the manufacturing equipment 124). In some embodiments, the corrective action includes causing design optimization (e.g., updating manufacturing parameters, manufacturing processes, manufacturing equipment 124, etc. for an optimized product). In some embodiments, the corrective action includes a updating a recipe (e.g., manufacturing equipment 124 to be in an idle mode, a sleep mode, a warm-up mode, etc.).

Predictive server 112, server machine 170, and server machine 180 may each include one or more computing devices such as a rackmount server, a router computer, a server computer, a personal computer, a mainframe computer, a laptop computer, a tablet computer, a desktop computer, Graphics Processing Unit (GPU), accelerator Application-Specific Integrated Circuit (ASIC) (e.g., Tensor Processing Unit (TPU)), etc.

Predictive server 112 may include a predictive component 114. In some embodiments, the predictive component 114 may receive current sensor data 146, and/or current manufacturing parameters 154 (e.g., receive from the client device 120, retrieve from the data store 140) and generate output (e.g., predictive data 168) for performing corrective action associated with the manufacturing equipment 124 based on the current data. In some embodiments, the predictive component 114 may use one or more trained models 190 to determine the output for performing the corrective action based on current data.

In some embodiments, model 190 may include a trained physics-based digital twin model. The physics-based model may be capable of solving systems of equations describing physical phenomena that may occur in the manufacturing chamber, such as equations governing heat flow, energy balance, gas conductance, mass balance, fluid dynamics, or the like. In some embodiments, the physics-based model performs calculations of gas conductance in the manufacturing chamber. Manufacturing parameters 150 may be provided to the trained physics-based model. The trained physics-based model may provide as output modeled property values indicative of conditions within the chamber, corresponding to sensors 126 disposed within the manufacturing chamber (e.g., manufacturing equipment 124). The output of the physics-based model may be stored in data store 140 as simulated sensor data 162.

Predictive component 114 of predictive server 112 may receive output indicative of simulated sensor data from the trained physics-based digital twin model. Predictive component 114 may compare output of the trained physics-based model to current sensor data 146. Based on the comparison, predictive component 114 may determine one or more differences between the simulated sensor readings and the actual sensor readings. The physics-based digital twin model may have been trained on data from a healthy or optimal chamber. A chamber having a healthy or optimal state may be expected to produce measured sensor readings that approximately match simulated sensor readings of the trained digital twin model. Predictive component 114 may determine whether the determined differences are greater than one or more difference thresholds. In one embodiment, multiple difference thresholds are used, where a separate difference threshold is associated with each type of sensor reading. Alternatively, a single difference threshold may be used. Differences above a threshold value in simulated sensor readings from the model and measured sensor readings from sensors 126 may be indicative of failure of manufacturing equipment components, chamber drift, sensor drift, or the like. Differences can be analyzed by other algorithms and models (in some cases, also included in model 190). Predictive component 114 may also produce predictive data 168 indicative of actual conditions in the manufacturing chamber, e.g., if it is predicted that a sensor is providing an inaccurate reading. In one embodiment, the actual sensor readings and the predicted sensor readings are input into a trained machine learning model (e.g., such as a neural network), which outputs an indication of one or more components that are predicted to have caused or contributed to the differences between the actual sensor measurements and the predicted senor measurements.

Historical sensor data 144 and historical manufacturing parameters 152 may be used to train the physics-based model. In some embodiments, the physics-based model can capture the majority of physical phenomena that may occur in the manufacturing chamber before training, but some aspects may not be described by the physics-based model. Such aspects may include aging or non-ideal components, manufacturing tolerance or manufacturing inaccuracy induced variation, incomplete description of the chamber, or the like. By providing historical data to the physics-based model, parameters in the model may be adjusted to account for these inaccuracies.

In some embodiments, sensor data 142 may include data collected from sensors 126 during a manufacturing run that produced an acceptable product (e.g., as measured by metrology equipment 128). A manufacturing run that produces an acceptable product may be referred to as a golden run. Sensor data associated with such a manufacturing run may be stored in data store 140 as golden run sensor data 148. Predictive component 114 of predictive server 112 may compare golden run sensor data 148, current sensor data 146, and simulated sensor data 162 (e.g., as output by the trained physics-based model) to determine if component failure, drift, or the like has occurred. In some embodiments, some or all of these operations may instead be performed by a different device, e.g., client device 120, server machine 170, server machine 180, etc.

In some embodiments, predictive component 114 may determine which components contribute to differences between simulated sensor data 162, current sensor data 146, and/or golden run sensor data 148. This may be performed by connecting which sensor differences are likely to result from what kind of faults. As an example, if all pressure sensor readings are consistent, but current sensor data 146 provides a different value for the position of an actuator that controls the pressure in the chamber by adjusting gas conductance, it may be surmised that the pressure in the chamber is correct, the pressure sensors involved in a closed control loop with the actuator are operating correctly, and the actuator has in some way drifted, perhaps due to damage, wear, deposition, erosion, or the like.

In some embodiments, predictive component 114 may provide differences in the various sensor data to a trained machine learning model (in some cases, included in model 190). The trained machine learning model may be configured to take as input, data indicative of sensor data (e.g., simulated sensor data, current sensor data, pre-processed versions thereof, etc.) and produce as output components likely to be contributing to differences in sensor data, in some embodiments with each component's degree of contribution to the difference.

The machine learning model may be trained using historical sensor data 144, and simulated sensor data 162, generated using historical manufacturing parameters 152 corresponding to the runs where historical sensor data 144 was measured. One type of machine learning model that may be used to perform some or all of the above tasks is an artificial neural network, such as a deep neural network. Artificial neural networks generally include a feature representation component with a classifier or regression layers that map features to a desired output space. A convolutional neural network (CNN), for example, hosts multiple layers of convolutional filters. Pooling is performed, and non-linearities may be addressed, at lower layers, on top of which a multi-layer perceptron is commonly appended, mapping top layer features extracted by the convolutional layers to decisions (e.g. classification outputs). Deep learning is a class of machine learning algorithms that use a cascade of multiple layers of nonlinear processing units for feature extraction and transformation. Each successive layer uses the output from the previous layer as input. Deep neural networks may learn in a supervised (e.g., classification) and/or unsupervised (e.g., pattern analysis) manner. Deep neural networks include a hierarchy of layers, where the different layers learn different levels of representations that correspond to different levels of abstraction. In deep learning, each level learns to transform its input data into a slightly more abstract and composite representation. In an image recognition application, for example, the raw input may be a matrix of pixels; the first representational layer may abstract the pixels and encode edges; the second layer may compose and encode arrangements of edges; the third layer may encode higher level shapes (e.g., teeth, lips, gums, etc.); and the fourth layer may recognize a scanning role. Notably, a deep learning process can learn which features to optimally place in which level on its own. The "deep" in "deep learning" refers to the number of layers through which the data is transformed. More precisely, deep learning systems have a substantial credit assignment path (CAP) depth. The CAP is the chain of transformations from input to output. CAPs describe potentially causal connections between input and output. For a feedforward neural network, the depth of the CAPs may be that of the network and may be the number of hidden layers plus one. For recurrent neural networks, in which a signal may propagate through a layer more than once, the CAP depth is potentially unlimited.

Use of a physics-based digital twin model in connection with manufacturing equipment has significant technical advantages compared to operating manufacturing equipment without such a model. Multiple components (sensors, hardware, processing, etc.) may be tied together in a closed control loop. If there is a problem with any piece of equipment in a closed control loop, other components may adjust set points, etc., and readings may return to target values, yet the actual conditions inside the chamber may have changed. This leads to less consistent substrate production; loss of productivity;

energy, time, and material inefficiencies; and can lead to premature component failure, increased maintenance costs, etc. In some embodiments, multiple data streams indicative of the same property may be monitored, to provide additional evidence of the root cause of a shift in sensor data, chamber conditions, or the like. In some embodiments, sensors indicative of chamber pressure are monitored. The sensors may include sensors measuring chamber pressure, actuator position of an actuator that affects chamber pressure, RF match voltage, RF match current, RF match capacitor position, etc. Some of these properties may be measured by more than one sensor. For example, the manufacturing chamber may be equipped with multiple pressure sensors, a subset of which are involved in a closed control loop, another subset of which are freely providing measurements of chamber conditions.

In some embodiments, predictive component 114 receives current sensor data 146 and/or current manufacturing parameters 154, performs signal processing to break down the current data into sets of current data, provides the sets of current data as input to a trained model 190, and obtains outputs indicative of predictive data 168 from the trained model 190. In some embodiments, predictive data is indicative of metrology data (e.g., prediction of substrate quality). In some embodiments, predictive data is indicative of component health.

In some embodiments, the various models discussed in connection with model 190 (e.g., physics-based digital twin model, predictive machine learning model, etc.) may be combined in one model (e.g., an ensemble model), or may be separate models. Predictive component 114 may receive current sensor data 146 and current manufacturing parameters 154, provide the data to a trained model 190, and receive information indicative of how much several components in the manufacturing chamber have drifted from their previous performance. Data may be passed back and forth between several distinct models included in model 190 and predictive component 114. In some embodiments, some or all of these operations may instead be performed by a different device, e.g., client device 120, server machine 170, server machine 180, etc. It will be understood by one of ordinary skill in the art that variations in data flow, which components perform which processes, which models are provided with which data, and the like are within the scope of this disclosure.

Data store 140 may be a memory (e.g., random access memory), a drive (e.g., a hard drive, a flash drive), a database system, or another type of component or device capable of storing data. Data store 140 may include multiple storage components (e.g., multiple drives or multiple databases) that may span multiple computing devices (e.g., multiple server computers). The data store 140 may store sensor data 142, manufacturing parameters 150, metrology data 160, simulated sensor data 162, and predictive data 168. Sensor data 142 may include historical sensor data 144 and current sensor data 146. Sensor data may include sensor data time traces over the duration of manufacturing processes, associations of data with physical sensors, pre-processed data, such as averages and composite data, and data indicative of sensor performance over time (i.e., many manufacturing processes). Manufacturing parameters 150 and metrology data 160 may contain similar features. Historical sensor data 144 and historical manufacturing parameters 152 may be historical data (e.g., at least a portion for training model 190). Current sensor data 146 may be current data (e.g., at least a portion to be input into learning model 190, subsequent to the historical data) for which predictive data 168 is to be generated (e.g., for performing corrective actions). Simulated sensor data may include data indicative of predicted sensor readings of any of sensors 126 associated with manufacturing equipment 124. Simulated sensor data may include both current and historical data.

In some embodiments, predictive system 110 further includes server machine 170 and server machine 180. Server machine 170 includes a data set generator 172 that is capable of generating data sets (e.g., a set of data inputs and a set of target outputs) to train, validate, and/or test model(s) 190, including a physics-based digital twin models, and in some embodiments one or more machine learning models. Some operations of data set generator 172 are described in detail below with respect to FIGS. 2A-B and 4A. In some embodiments, the data set generator 172 may partition the historical data (e.g., historical sensor data 144, historical manufacturing parameters 152, simulated sensor data 162 stored in data store 140) into a training set (e.g., sixty percent of the historical data), a validating set (e.g., twenty percent of the historical data), and a testing set (e.g., twenty percent of the historical data). In some embodiments, predictive system 110 (e.g., via predictive component 114) generates multiple sets of features. For example a first set of features may correspond to a first set of types of sensor data (e.g., from a first set of sensors, first combination of values from first set of sensors, first patterns in the values from the first set of sensors) that correspond to each of the data sets (e.g., training set, validation set, and testing set) and a second set of features may correspond to a second set of types of sensor data (e.g., from a second set of sensors different from the first set of sensors, second combination of values different from the first combination, second patterns different from the first patterns) that correspond to each of the data sets.

Server machine 180 includes a training engine 182, a validation engine 184, selection engine 185, and/or a testing engine 186. An engine (e.g., training engine 182, a validation engine 184, selection engine 185, and a testing engine 186) may refer to hardware (e.g., circuitry, dedicated logic, programmable logic, microcode, processing device, etc.), software (such as instructions run on a processing device, a general purpose computer system, or a dedicated machine), firmware, microcode, or a combination thereof. The training engine 182 may be capable of training a model 190 using one or more sets of features associated with the training set from data set generator 172. The training engine 182 may generate multiple trained models 190, where each trained model 190 corresponds to a distinct set of features of the training set (e.g., sensor data from a distinct set of sensors). For example, a first trained model may have been trained using all features (e.g., X1-X5), a second trained model may have been trained using a first subset of the features (e.g., X1, X2, X4), and a third trained model may have been trained using a second subset of the features (e.g., X1, X3, X4, and X5) that may partially overlap the first subset of features. Data set generator 172 may receive the output of a trained model (e.g., a physics-based digital twin model), collect that data into training, validation, and testing data sets, and use the data sets to train a second model (e.g., a machine learning model configured to output predictive data, corrective actions, etc.).

The validation engine 184 may be capable of validating a trained model 190 using a corresponding set of features of the validation set from data set generator 172. For example, a first trained model 190 that was trained using a first set of features of the training set may be validated using the first set of features of the validation set. The validation engine 184 may determine an accuracy of each of the trained models 190 based on the corresponding sets of features of the validation set. The validation engine 184 may discard trained models 190 that have an accuracy that does not meet a threshold accuracy. In some embodiments, the selection engine 185 may be capable of selecting one or more trained models 190 that have an accuracy that meets a threshold accuracy. In some embodiments, the selection engine 185 may be capable of selecting the trained model 190 that has the highest accuracy of the trained models 190.

The testing engine 186 may be capable of testing a trained model 190 using a corresponding set of features of a testing set from data set generator 172. For example, a first trained model 190 that was trained using a first set of features of the training set may be tested using the first set of features of the testing set. The testing engine 186 may determine a trained model 190 that has the highest accuracy of all of the trained models based on the testing sets.

In the case of a machine learning model (e.g., a model that takes as input data from sensors 126 and simulated sensor data generated by a physics-based digital twin model), model 190 may refer to the model artifact that is created by the training engine 182 using a training set that includes data inputs and corresponding target outputs (correct answers for respective training inputs). Patterns in the data sets can be found that map the data input to the target output (the correct answer), and the machine learning model 190 is provided mappings that captures these patterns. The machine learning model 190 may use one or more of Support Vector Machine (SVM), Radial Basis Function (RBF), clustering, supervised machine learning, semi-supervised machine learning, unsupervised machine learning, k-Nearest Neighbor algorithm (k-NN), linear regression, random forest, neural network (e.g., artificial neural network), etc.

Predictive component 114 may provide current sensor data 146 to model 190 and may run model 190 on the input to obtain one or more outputs. Predictive component 114 may be capable of determining (e.g., extracting) predictive data 168 from the output of model 190 and may determine (e.g., extract) confidence data from the output that indicates a level of confidence that the predictive data 168 is an accurate predictor of a process associated with the input data for products produced or to be produced using the manufacturing equipment 124 at the current sensor data 146 and/or current manufacturing parameters 154. The predictive component 114 or corrective action component 122 may use the confidence data to decide whether to cause a corrective action associated with the manufacturing equipment 124 based on the predictive data 168.

The confidence data may include or indicate a level of confidence that the predictive data 168 is an accurate prediction for products or components associated with at least a portion of the input data. In one example, the level of confidence is a real number between 0 and 1 inclusive, where 0 indicates no confidence that the predictive data 168 is an accurate prediction for products processed according to input data or component health of components of manufacturing equipment 124 and 1 indicates absolute confidence that the predictive data 168 accurately predicts properties of products processed according to input data or component health of components of manufacturing equipment 124. Responsive to the confidence data indicating a level of confidence below a threshold level for a predetermined number of instances (e.g., percentage of instances, frequency of instances, total number of instances, etc.) the predictive component 114 may cause the trained model 190 to be re-trained (e.g., based on current sensor data 146, current manufacturing parameters 154, etc.).

For purpose of illustration, rather than limitation, aspects of the disclosure describe the training of one or more machine learning models 190 using historical data (e.g., historical sensor data 144, historical manufacturing parameters 152) and inputting current data (e.g., current sensor data 146, current manufacturing parameters 154, and current metrology data 164) into the one or more trained machine learning models to determine predictive data 168. In other embodiments, a heuristic model or rule-based model is used to determine predictive data 168 (e.g., without using a trained machine learning model). Predictive component 114 may monitor historical sensor data 144, historical manufacturing parameters 152, simulated sensor data 162, and metrology data 160. Any of the information described with respect to data inputs 210 of FIGS. 2A-B may be monitored or otherwise used in the heuristic or rule-based model.

In some embodiments, the functions of client device 120, predictive server 112, server machine 170, and server machine 180 may be provided by a fewer number of machines. For example, in some embodiments server machines 170 and 180 may be integrated into a single machine, while in some other embodiments, server machine 170, server machine 180, and predictive server 112 may be integrated into a single machine. In some embodiments, client device 120 and predictive server 112 may be integrated into a single machine.

In general, functions described in one embodiment as being performed by client device 120, predictive server 112, server machine 170, and server machine 180 can also be performed on predictive server 112 in other embodiments, if appropriate. In addition, the functionality attributed to a particular component can be performed by different or multiple components operating together. For example, in some embodiments, the predictive server 112 may determine the corrective action based on the predictive data 168. In another example, client device 120 may determine the predictive data 168 based on output from the trained machine learning model.

In addition, the functions of a particular component can be performed by different or multiple components operating together. One or more of the predictive server 112, server machine 170, or server machine 180 may be accessed as a service provided to other systems or devices through appropriate application programming interfaces (API).

In embodiments, a "user" may be represented as a single individual. However, other embodiments of the disclosure encompass a "user" being an entity controlled by a plurality of users and/or an automated source. For example, a set of individual users federated as a group of administrators may be considered a "user."

Embodiments of the disclosure may be applied to data quality evaluation, feature enhancement, model evaluation, Virtual Metrology (VM), Predictive Maintenance (PdM), limit optimization, or the like.

Figure 2A:
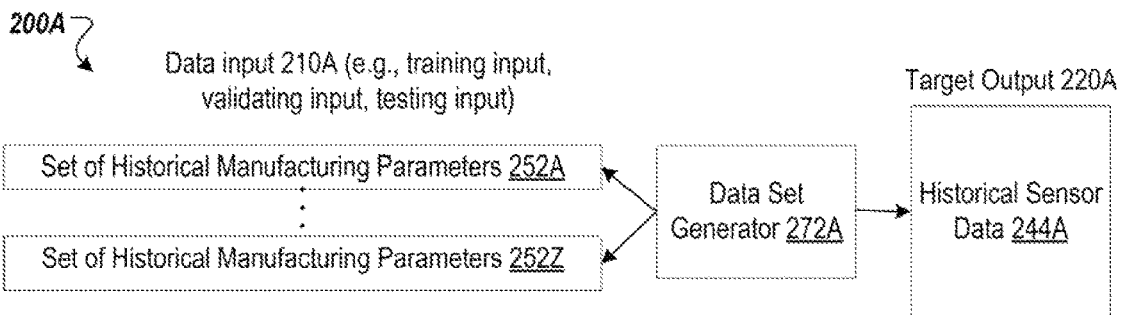
FIGS. 2A-B illustrate data set generators to create data sets for models, according to certain embodiments.
Figure 2B:
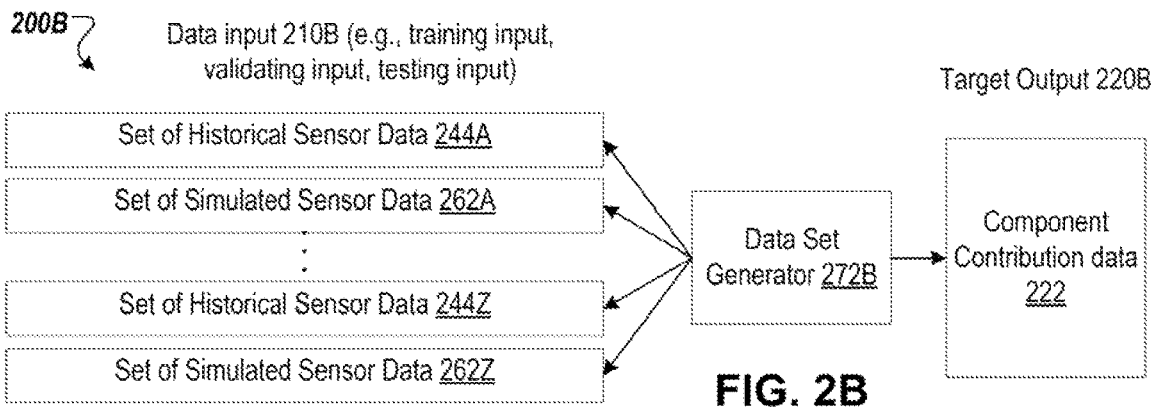

FIGS. 2A-B are one or more example data set generators 272 (e.g., data set generator 172 of FIG. 1) to create data sets for training, testing, validating, etc. a model (e.g., model 190 of FIG. 1), according to certain embodiments. Each data set generator 272 may be part of server machine 170 of FIG. 1. In some embodiments, data set generator 272 both of FIGS. 2A-B are the same data set generator. In some embodiments, data set generator from each of FIGS. 2A-B is a separate data set generator.

Referring to FIG. 2A, system 200A containing data set generator 272A (e.g., data set generator 172 of FIG. 1) creates data sets for a physics-based digital twin model (e.g., model 190 of FIG. 1). Data set generator 272A may create data sets (e.g., data input 210A) using historical manufacturing parameters 252 (e.g., historical manufacturing parameters 152 of FIG. 1). System 200A may be used to generate data sets to train, test, and validate an physics-based digital twin model. The physics-based model, in some embodiments, is provided with historical sensor data 244A as target output 220A. The physics-based model may be configured to solve a system of equations describing physical phenomena that may occur in a manufacturing chamber. Aspects of the process, such as chamber geometry, chamber composition, gas composition, etc. may be represented in the model by certain parameters. The training process may adjust some or all of these parameters to produce output from the physics-based model consistent with target output 220A (e.g., to more accurately capture physical phenomena in the chamber). System 200A of FIG. 2A shows data set generator 272A, data inputs 210A, and target output 220A.

Referring to FIG. 2B, system 200B containing data set generator 272B (e.g., data set generator 172 of FIG. 1) creates data sets for a machine learning model that may be used in combination with a physics-based digital twin model in some embodiments (e.g., model 190 of FIG. 1). Data set generator 272B may create data sets using historical sensor data 244 and simulated sensor data 262. These data sets may be supplied to a machine learning model, e.g. model 190 of FIG. 1, as training input. Data set generator 272B may also provide component contribution data to the machine learning model during training as target output. The component contribution data may be obtained by performing experiments with a known offset(s) introduced in certain components of the manufacturing equipment. The machine learning model may be trained to reproduce the known offsets. In some embodiments, input data may further include golden run sensor data.

Referring to FIGS. 2A-B, in some embodiments, data set generator 272 generates a data set (e.g., training set, validating set, testing set) that includes one or more data inputs 210 (e.g., training input, validating input, testing input) and may include one or more target outputs 220 that correspond to the data inputs 210. The data set may also include mapping data that maps the data inputs 210 to the target outputs 220. Data inputs 210 may also be referred to as "features," "attributes," or "information." In some embodiments, data set generator 272 may provide the data set to the training engine 182, validating engine 184, or testing engine 186, where the data set is used to train, validate, or test the model 190 (e.g., one of the models that are included in model 190, ensemble model 190, etc.). In some embodiments, model 190 may include a physics-based digital twin model and a model used to analyze the output of the physics-based model. In some embodiments, data set generator 272 may supply input to the physics-based model as training input (e.g., manufacturing parameters), and may provide as target output data associated with the output of a second model (e.g., component contribution data from a machine learning model), and model 190 may be trained using these associated data sets. Some embodiments of generating a training set may further be described with respect to FIG. 4A.

In some embodiments, data set generator 272 generates data input 210 and does not generate target output 220 (e.g., data set generator 272A generating sets of historical metrology data 262A-262Z as data input 210A), to supply to an unsupervised machine learning model. In some embodiments, data set generator 272 generates the data input 210 and target output 220 (e.g., to train an unsupervised or semi-supervised model). In some embodiments, data inputs 210 may include one or more sets of data. As an example, system 200B may produce sets of sensor data that may include one or more of sensor data from one or more types of sensors, combination of sensor data from one or more types of sensors, patterns from sensor data from one or more types of sensors, manufacturing parameters from one or more manufacturing parameters, combinations of some manufacturing parameter data and some sensor data, etc.

In some embodiments, data set generator 272 may generate a first data input corresponding to a first set of historical sensor data 244A and/or historical manufacturing parameters 252A to train, validate, or test a first machine learning model and the data set generator 272 may generate a second data input corresponding to a second set of historical sensor data 244B and/or historical manufacturing parameters 252B to train, validate, or test a second machine learning model.

Data inputs 210 and target outputs 220 to train, validate, or test a machine learning model may include information for a particular manufacturing chamber (e.g., for particular substrate manufacturing equipment). For example, historical manufacturing parameters 252, historical sensor data 244, simulated sensor data 262, and component contribution data 222 may be associated with the same manufacturing chamber.

In some embodiments, the information used to train the machine learning model may be from specific types of manufacturing equipment (e.g., manufacturing equipment 124 of FIG. 1) of the manufacturing facility having specific characteristics and allow the trained model(s) to determine outcomes for a specific group of manufacturing equipment 124 based on input for current sensor data (e.g., current sensor data 146) associated with one or more components sharing characteristics of the specific group. In some embodiments, the information used to train the model may be for components from two or more manufacturing facilities and may allow the trained machine learning model to determine outcomes for components based on input from one manufacturing facility.

In some embodiments, subsequent to generating a data set and training, validating, or testing a machine learning model 190 using the data set, model 190 may be further trained, validated, or tested, or adjusted (e.g., adjusting weights or parameters associated with input data of model 190, such as parameters in a physics-based model or connection weights in a neural network).

Figure 3:
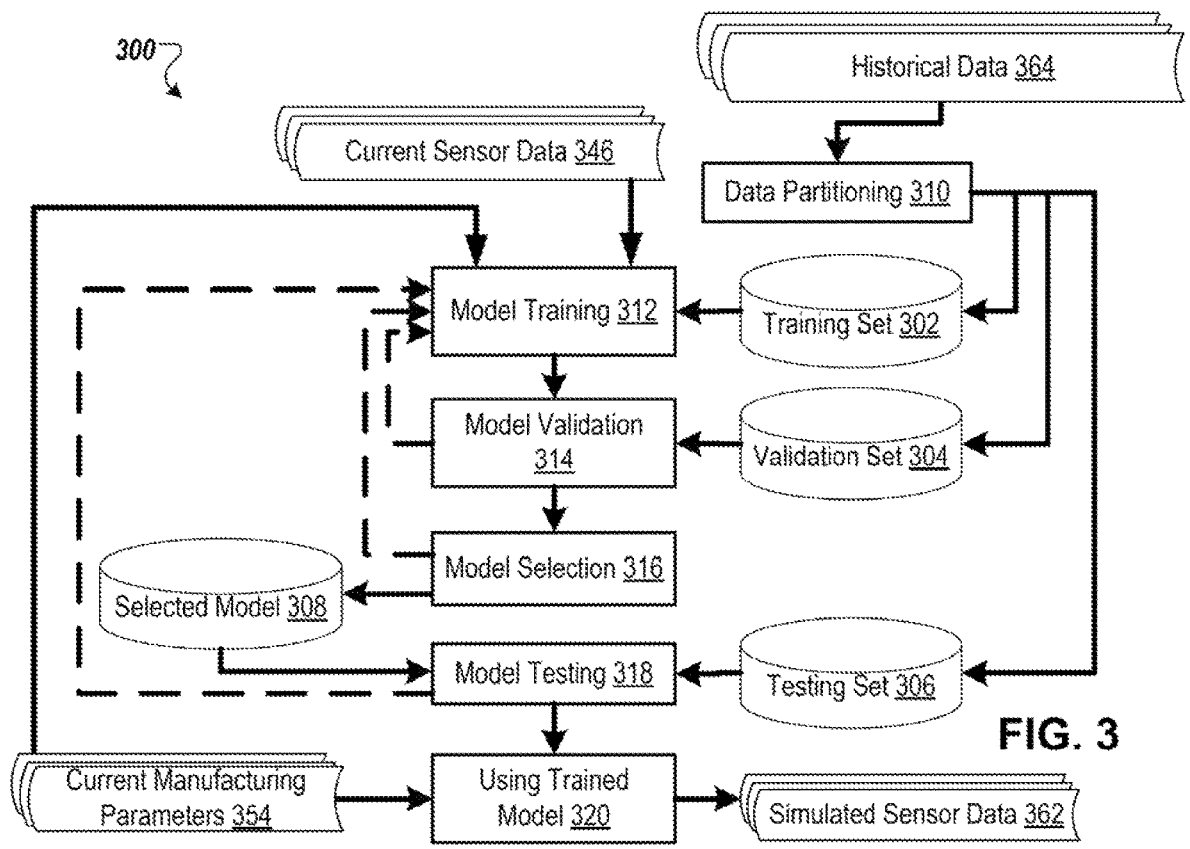
FIG. 3 is a block diagram illustrating determining predictive data, according to certain embodiments.

FIG. 3 is a block diagram illustrating system 300 for generating output data (e.g., predictive data 168 of FIG. 1), according to some embodiments. In some embodiments, system 300 may be used to in conjunction with a physics-based model (e.g., model 190 of FIG. 1) to determine simulated sensor data, which may inform performance of a corrective action (e.g., a corrective action may be performed in view of simulated sensor data). In some embodiments, a system analogous to system 300 may be using in conjunction with a machine learning model to determine a corrective action associated with manufacturing equipment.

At block 310, the system 300 (e.g., components of predictive system 110 of FIG. 1) performs data partitioning (e.g., via data set generator 172 of server machine 170 of FIG. 1) of the historical data 364 (e.g., historical manufacturing parameters 152 and historical sensor data 144 for model 190 of FIG. 1) to generate the training set 302, validation set 304, and testing set 306. For example, the training set may be 60% of the historical data, the validation set may be 20% of the historical data, and the testing set may be 20% of the historical data.

The generation of training set 302, validation set 304, and testing set 306 can be tailored for a particular application. For example, the training set may be 60% of the historical data, the validation set may be 20% of the historical data, and the testing set may be 20% of the historical data. System 300 may generate a plurality of sets of features for each of the training set, the validation set, and the testing set. For example, if historical data 364 includes features derived from sensor data from 20 sensors (e.g., sensors 126 of FIG. 1) and 10 manufacturing parameters (e.g., manufacturing parameters that correspond to the sensor data from the 20 sensors), the sensor data may be divided into a first set of features including sensors 1-10 and a second set of features including sensors 11-20. The manufacturing parameters may also be divided into sets, for instance a first set of manufacturing parameters including parameters 1-5, and a second set of manufacturing parameters including parameters 6-10. Either target input, target output, both, or neither may be divided into sets. Multiple models may be trained on different sets of data.

At block 312, system 300 performs model training (e.g., via training engine 182 of FIG. 1) using the training set 302.

Training of a machine learning model and/or of a physics-based model (e.g., a digital twin) may be achieved in a supervised learning manner, which involves feeding a training dataset including labeled inputs through the model, observing its outputs, defining an error (by measuring the difference between the outputs and the label values), and using techniques such as deep gradient descent and backpropagation to tune the weights of the model such that the error is minimized. In many applications, repeating this process across the many labeled inputs in the training dataset yields a model that can produce correct output when presented with inputs that are different than the ones present in the training dataset.

For each training data item in the training dataset, the training data item may be input into the model (e.g., into the physics-based model). The model may then process the input training data item (e.g., a process recipe from a historical golden run) to generate an output. The output may include, for example, multiple simulated sensor readings. The output may be compared to a label of the training data item (e.g., actual sensor readings that were measured).

Processing logic may then compare the generated output (e.g., sensor readings) to the label (e.g., actual sensor readings) that was included in the training data item. Processing logic determines an error (i.e., a classification error) based on the differences between the output and the label(s). Processing logic adjusts one or more weights and/or values of the model based on the error.

In the case of training a neural network, an error term or delta may be determined for each node in the artificial neural network. Based on this error, the artificial neural network adjusts one or more of its parameters for one or more of its nodes (the weights for one or more inputs of a node). Parameters may be updated in a back propagation manner, such that nodes at a highest layer are updated first, followed by nodes at a next layer, and so on. An artificial neural network contains multiple layers of "neurons", where each layer receives as input values from neurons at a previous layer. The parameters for each neuron include weights associated with the values that are received from each of the neurons at a previous layer. Accordingly, adjusting the parameters may include adjusting the weights assigned to each of the inputs for one or more neurons at one or more layers in the artificial neural network.

System 300 may train multiple models using multiple sets of features of the training set 302 (e.g., a first set of features of the training set 302, a second set of features of the training set 302, etc.). For example, system 300 may train a model to generate a first trained model using the first set of features in the training set (e.g., sensor data from sensors 1-10) and to generate a second trained model using the second set of features in the training set (e.g., sensor data from sensors 11-20). In some embodiments, the first trained model and the second trained model may be combined to generate a third trained model (e.g., which may be a better predictor than the first or the second trained model on its own). In some embodiments, sets of features used in comparing models may overlap (e.g., first set of features being sensor data from sensors 1-15 and second set of features being sensors 5-20). In some embodiments, hundreds of models may be generated including models with various permutations of features and combinations of models.

At block 314, system 300 performs model validation (e.g., via validation engine 184 of FIG. 1) using the validation set 304. The system 300 may validate each of the trained models using a corresponding set of features of the validation set 304. For example, system 300 may validate the first trained model using the first set of features in the validation set (e.g., sensor data from sensors 1-10) and the second trained model using the second set of features in the validation set (e.g., sensor data from sensors 11-20). In some embodiments, system 300 may validate hundreds of models (e.g., models with various permutations of features, combinations of models, etc.) generated at block 312. At block 314, system 300 may determine an accuracy of each of the one or more trained models (e.g., via model validation) and may determine whether one or more of the trained models has an accuracy that meets a threshold accuracy. Responsive to determining that none of the trained models has an accuracy that meets a threshold accuracy, flow returns to block 312 where the system 300 performs model training using different sets of features of the training set. Responsive to determining that one or more of the trained models has an accuracy that meets a threshold accuracy, flow continues to block 316. System 300 may discard the trained models that have an accuracy that is below the threshold accuracy (e.g., based on the validation set).

At block 316, system 300 performs model selection (e.g., via selection engine 185 of FIG. 1) to determine which of the one or more trained models that meet the threshold accuracy has the highest accuracy (e.g., the selected model 308, based on the validating of block 314). Responsive to determining that two or more of the trained models that meet the threshold accuracy have the same accuracy, flow may return to block 312 where the system 300 performs model training using further refined training sets corresponding to further refined sets of features for determining a trained model that has the highest accuracy.

At block 318, system 300 performs model testing (e.g., via testing engine 186 of FIG. 1) using testing set 306 to test selected model 308.Ssystem 300 may test, using the first set of features in the testing set (e.g., sensor data from sensors 1-10), the first trained model to determine the first trained model meets a threshold accuracy (e.g., based on the first set of features of the testing set 306). Responsive to accuracy of the selected model 308 not meeting the threshold accuracy (e.g., the selected model 308 is overly fit to the training set 302 and/or validation set 304 and is not applicable to other data sets such as the testing set 306), flow continues to block 312 where system 300 performs model training (e.g., retraining) using different training sets corresponding to different sets of features (e.g., sensor data from different sensors). Responsive to determining that selected model 308 has an accuracy that meets a threshold accuracy based on testing set 306, flow continues to block 320. In at least block 312, the model may learn patterns in the historical data to make predictions and in block 318, the system 300 may apply the model on the remaining data (e.g., testing set 306) to test the predictions.

At block 320, system 300 uses the trained model (e.g., selected model 308) to receive current manufacturing parameters 354 (e.g., current manufacturing parameters 154 of FIG. 1) and determines (e.g., extracts), from the output of the trained model, simulated sensor data 362 (e.g., simulated sensor data 162 of FIG. 1). A corrective action associated with the manufacturing equipment 124 of FIG. 1 may be performed in view of simulated sensor data 362. In some embodiments, current manufacturing parameters 354 may correspond to the same types of features in the historical manufacturing parameter data. In some embodiments, current manufacturing parameters 354 corresponds to a same type of features as a subset of the types of features in historical manufacturing parameter data that are used to train selected model 308.

In some embodiments, current data is received. Current data may include current sensor data 346 (e.g., current sensor data 146 of FIG. 1). Model 308 is re-trained based on the current data. In some embodiments, a new model is trained based on the current sensor data 346 and the current manufacturing parameters 354.

In some embodiments, one or more of the acts 310-320 may occur in various orders and/or with other acts not presented and described herein. In some embodiments, one or more of acts 310-320 may not be performed. For example, in some embodiments, one or more of data partitioning of block 310, model validation of block 314, model selection of block 316, or model testing of block 318 may not be performed.

FIG. 3 depicts a system configured for training, validating, testing, and using a physics-based digital twin model. The physics-based model is configured to accept as input manufacturing parameters (e.g., set points provided to manufacturing equipment) and provide as output simulated sensor data (e.g., predicted sensor data). Other models in connection with this physics-based model may follow a similar data flow in training, validating, testing and using. In some embodiments, a model may receive simulated sensor data and measured sensor data, and be configured to output a list of components predicted to contribute to differences between the two data sets. The model may provide estimates of how much each component is contributing to the variations. For example, the model may provide an estimate of pressure sensor contribution, actuator contribution, etc. Partitioning, training, validating, selection, testing, and using blocks of system 300 may be executed similarly to train a second model, utilizing different data types of data. Retraining may also be done, utilizing current simulated sensor data and current measured sensor data. In some embodiments, golden run data may also be supplied for partitioning, training, validation, selection, testing, and using of a machine learning model.

FIGS. 4A-D are flow diagrams of methods 400A-D associated with generating predictive data to cause a corrective action, according to certain embodiments. Methods 400A-D may be performed by processing logic that may include hardware (e.g., circuitry, dedicated logic, programmable logic, microcode, processing device, etc.), software (such as instructions run on a processing device, a general purpose computer system, or a dedicated machine), firmware, microcode, or a combination thereof. In some embodiment, methods 400A-D may be performed, in part, by predictive system 110. Method 400A may be performed, in part, by predictive system 110 (e.g., server machine 170 and data set generator 172 of FIG. 1, data set generator 272 of FIG. 2A-B). Predictive system 110 may use method 400A to generate a data set to at least one of train, validate, or test a machine learning model, in accordance with embodiments of the disclosure. Method 400C may be performed by server machine 180 (e.g., training engine 182, etc.). Methods 400B and 400D may be performed by predictive server 112 (e.g., predictive component 114). In some embodiments, a non-transitory storage medium stores instructions that when executed by a processing device (e.g., of predictive system 110, of server machine 180, of predictive server 112, etc.) cause the processing device to perform one or more of methods 400A-D.

For simplicity of explanation, methods 400A-D are depicted and described as a series of operations. However, operations in accordance with this disclosure can occur in various orders and/or concurrently and with other operations not presented and described herein. Furthermore, not all illustrated operations may be performed to implement methods 400A-D in accordance with the disclosed subject matter. In addition, those skilled in the art will understand and appreciate that methods 400A-D could alternatively be represented as a series of interrelated states via a state diagram or events.

Figure 4A:
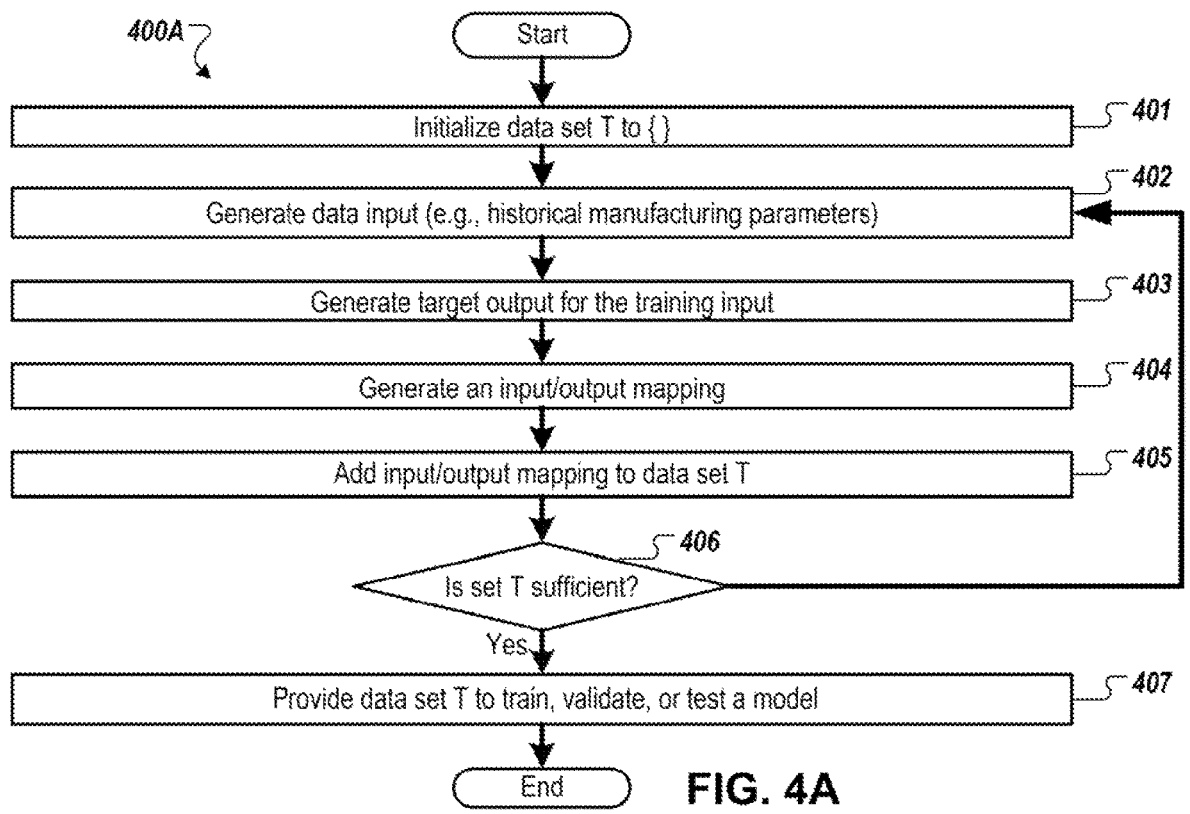
FIGS. 4A-D are flow diagrams of methods associated with generating predictive data to cause a corrective action, according to certain embodiments.

FIG. 4A is a flow diagram of a method 400A for generating a data set for a model for generating predictive data (e.g., predictive data 168 of FIG. 1), according to certain embodiments.

Referring to FIG. 4A, in some embodiments, at block 401 the processing logic implementing method 400A initializes a training set T to an empty set.

At block 402, processing logic generates first data input (e.g., first training input, first validating input) that may include one or more of sensor data (e.g., historical sensor data 144, simulated sensor data 162, or golden run sensor data 148 of FIG. 1; historical sensor data 244 of FIG. 2B), manufacturing parameters (e.g., historical manufacturing parameters 152 of FIG. 1), etc. In some embodiments, the first data input may include a first set of features for types of data and a second data input may include a second set of features for types of data (e.g., as described with respect to FIG. 3).

In some embodiments, at block 403, processing logic generates a first target output for one or more of the data inputs (e.g., first data input). In some embodiments, the first target output is simulated sensor data (e.g., for a physics-based digital twin model, such as what may be included in model 190). In some embodiments, input data may be in the form of sensor data and target output may be a list of components likely to be faulty, as in the case of a machine learning model configured to perform in connection with a physics-based digital twin model. In some embodiments, no target output is generated (e.g., an unsupervised machine learning model capable of grouping or finding correlations in input data, rather than requiring target output to be provided).

At block 404, processing logic optionally generates mapping data that is indicative of an input/output mapping. The input/output mapping (or mapping data) may refer to the data input (e.g., one or more of the data inputs described herein), the target output for the data input, and an association between the data input(s) and the target output. In some embodiments, such as in association with machine learning models where no target output is provided, block 404 may not be executed.

At block 405, processing logic adds the mapping data generated at block 404 to data set T, in some embodiments.

At block 406, processing logic branches based on whether data set T is sufficient for at least one of training, validating, and/or testing model 190. If so, execution proceeds to block 407, otherwise, execution continues back at block 402. It should be noted that in some embodiments, the sufficiency of data set T may be determined based simply on the number of inputs, mapped in some embodiments to outputs, in the data set, while in some other embodiments, the sufficiency of data set T may be determined based on one or more other criteria (e.g., a measure of diversity of the data examples, accuracy, etc.) in addition to, or instead of, the number of inputs.

At block 407, processing logic provides data set T (e.g., to server machine 180) to train, validate, and/or test machine learning model 190. In some embodiments, data set T is a training set and is provided to training engine 182 of server machine 180 to perform the training. In some embodiments, data set T is a validation set and is provided to validation engine 184 of server machine 180 to perform the validating. In some embodiments, data set T is a testing set and is provided to testing engine 186 of server machine 180 to perform the testing. In the case of a neural network, for example, input values of a given input/output mapping (e.g., numerical values associated with data inputs 210) are input to the neural network, and output values (e.g., numerical values associated with target outputs 220) of the input/output mapping are stored in the output nodes of the neural network. The connection weights in the neural network are then adjusted in accordance with a learning algorithm (e.g., back propagation, etc.), and the procedure is repeated for the other input/output mappings in data set T. After block 407, a model (e.g., model 190) can be at least one of trained using training engine 182 of server machine 180, validated using validating engine 184 of server machine 180, or tested using testing engine 186 of server machine 180. The trained model may be implemented by predictive component 114 (of predictive server 112) to generate predictive data 168 for performing signal processing or for performing corrective action associated with manufacturing equipment 124.

Figure 4B:
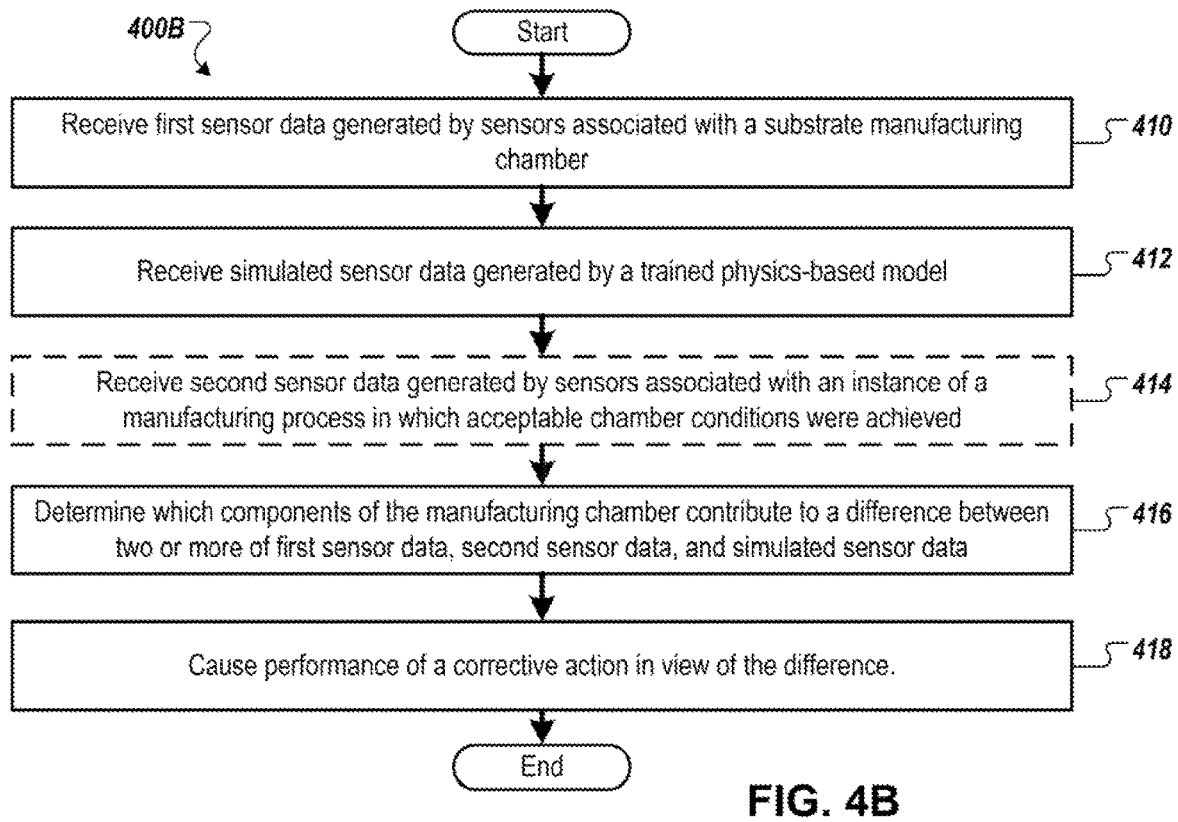

FIG. 4B is a method 400B for using a trained physics-based model to produce data indicative of a corrective action.

Referring to FIG. 4B, at block 410 of method 400B, the processing logic receives first sensor data (e.g., current sensor data 146 of FIG. 1) associated with a substrate manufacturing process performed by substrate manufacturing equipment (e.g., a substrate manufacturing chamber). As described above in connection with FIGS. 2-3, various preprocessing operations such as grouping, pattern recognition, combinations, etc. may be performed on any of the input data of method 400B. Sensor data may include data indicative of temperature, gas flow, hardware parameters (such as actuator or valve positions), pressure, RF match voltage, RF match current, RF match capacitor position, etc. In some embodiments, sensor data includes data indicative of (e.g., correlated with) pressure in the chamber.

At block 412, the processing logic receives simulated sensor data generated by a trained physics-based digital twin model. The physics-based model is designed to describe physical phenomena of interest within the manufacturing chamber. The physics-based model may provide solutions to systems of equations describing conditions in the chamber, such as heat flow, mass balance, fluid dynamics, etc. The physics-based model may calculate gas conductance through the manufacturing chamber.

At block 414, the processing logic optionally receives second sensor data associated with an instance of a manufacturing process wherein acceptable chamber conditions were achieved. Such a manufacturing run may be determined by sensors disposed in the chamber, metrology of the finished wafer, etc. A manufacturing run in which acceptable conditions were achieved will be called a golden run. Golden run data may be collected from sensors associated with the same manufacturing equipment as the sensors generating the first sensor data.

At block 416, the processing logic determines which components of the manufacturing chamber contribute to a difference between two or more of the first sensor data, the second sensor data, and the simulated sensor data. The processing device may compare two sets of sensor data (e.g., simulated and first sensor data) and determine if there are any differences greater than a threshold. In some embodiments, sensor data associated with steady state conditions is used. In some embodiments, the processing logic may use comparisons of sensor data values between several data sets to determine components that may be drifting or failing. Such a process is described in more detail in connection with FIG. 4D. In some embodiments, determining which components contribute to a difference between sensor data includes providing data (sensor data, differences between sensor data, other processing of sensor data, etc.) to a trained machine learning model. In some embodiments, the trained machine learning model may provide a list of components along with their relative contributions to any differences in the sensor data sets.

At block 418, performance of a corrective action is caused, in view of any differences between the sets of sensor data. The corrective action may be in association with components of manufacturing equipment associated with the sensors providing first and second sensor data. The corrective action may include scheduling maintenance for a component of the manufacturing equipment, e.g. the part(s) identified to be contributing to a difference between two or more sensor data sets. Maintenance may be corrective or preventative. The corrective action may include updating a manufacturing recipe, in some embodiments to account for drifting or aging components. The corrective action may include generating or updating an offset table. The offset table may contain information indicative of the performance of components of the manufacturing equipment. For example, the methods of this disclosure may reveal that a sensor reads incorrectly. An offset table may be kept and referenced in order to relate sensor readings to true chamber conditions. The offset table may include values of sensor offsets, including pressure sensor offsets, temperature sensor offsets, flow sensor offsets, etc. The offset table may include values of hardware sensor offsets, including position data for actuators, valves, etc. The offset table may include offset values for an actuator used to control pressure in the manufacturing chamber. Sensor readings received from sensors associated with manufacturing equipment or set points provided to components of manufacturing equipment may be adjusted by offset values in the offset table.

Figure 4C:
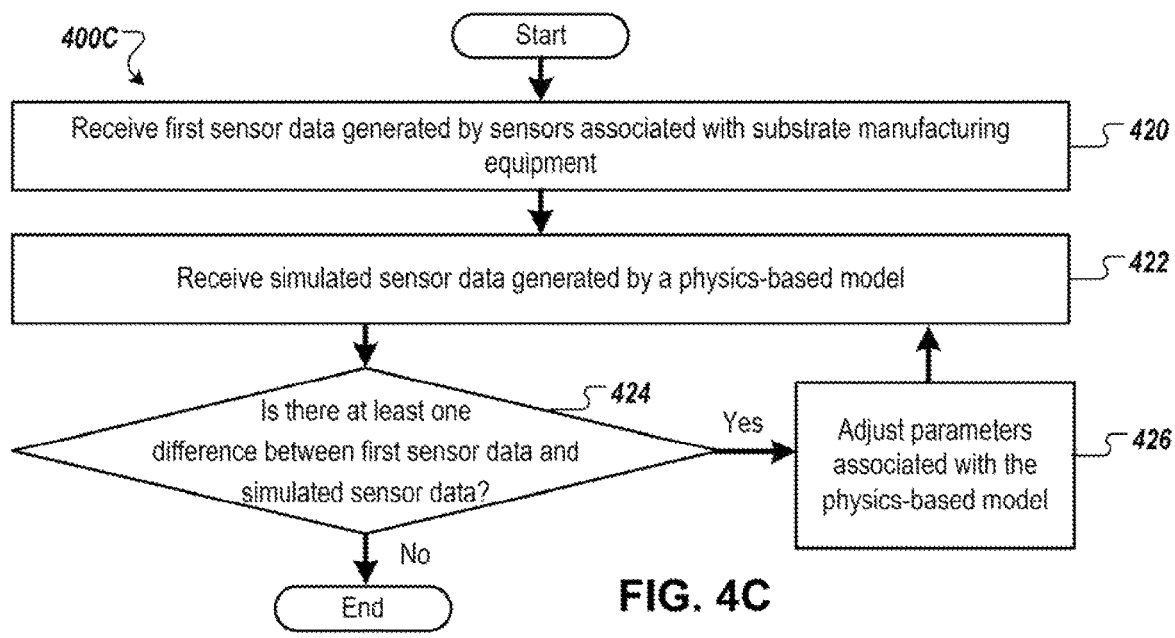

FIG. 4C is a method 400C for training a physics-based digital twin model, according to certain embodiments.

Referring to FIG. 4C, at block 420 of method 400C, processing logic receives sensor data generated by sensors associated with substrate manufacturing equipment. The data was generated during a manufacturing process. In some embodiments, sensor data associated with method 400C may be subject to pre-processing. Sensor data may take a variety of forms and be directed at a variety of properties inside the manufacturing chamber, and be within the scope of this disclosure.

At block 422, the processing logic receives simulated sensor data generated by a physics-based model. They physics-based model may be designed to describe physical phenomena in the chamber. In some embodiments, the physics-based model calculates gas conductance through the chamber, and produces simulated sensor data indicative of chamber pressure. In some cases, a physics-based model as initiated by a user may not perfectly describe a manufacturing chamber. There may be differences between modeled behavior and behavior of the physical device. Differences may be due to manufacturing tolerances, inaccurate assumption, incomplete description, aging components, etc.

At block 424, the processing logic determines if there is at least one difference between the sensor data generated by sensors associated with substrate manufacturing equipment and simulated sensor data generated by the physics-based model. A difference may be a difference larger than a threshold difference. The threshold may be related to manufacturing tolerance, measurement error, a percentage of the sensor value, a chosen level to ensure quality, etc. If no significant (e.g., larger than the threshold) difference is found, the method ends and the physics-based model has been successfully trained. If at least one significant difference is found, method 400C continues to block 426.

At block 426, the processing logic adjusts parameters associated with the physics-based model. This may include updating values in a calibration table (e.g., a pressure calibration table), updating parameters of the physics-based model corresponding to physical interactions in the chamber, or the like. Once the parameters have been adjusted, method 400C returns to block 422 and receives new simulated sensor data from the updated physics-based model. Blocks 424, 426, and 422 are then repeated until the differences between the sensor data generated by sensors associated with the manufacturing equipment and simulated sensor data generated by the physics-based model are less than a threshold value. At that time, method 400C ends and the physics-based model is considered to be trained.

Figure 4D:
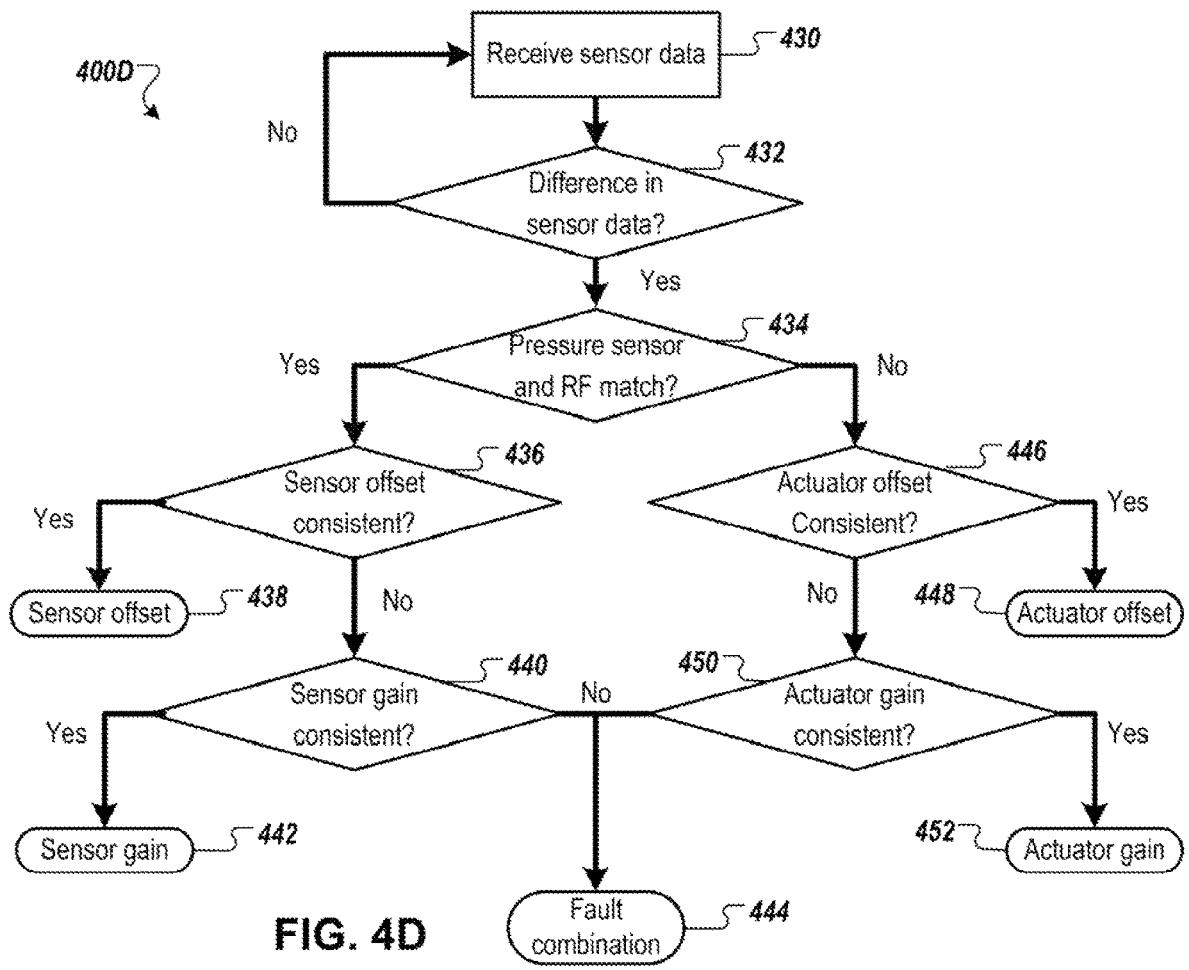

FIG. 4D is a flow chart of a method 400D for determining which components of manufacturing equipment contribute to unexpected sensor readings, according to some embodiments.

Method 400D is an example method for determining corrective actions associated with manufacturing equipment associated with measuring and maintaining pressure in a manufacturing chamber. Performing functions in a different order, checking different data at different points in the process, etc. may return similar results and such variations are within the scope of this disclosure. In some embodiments, method 400D may be repeated between every wafer processed in a manufacturing chamber. This allows alterations to the manufacturing process, corrective actions, etc. to be performed while minimizing waste. At block 430, processing logic receives sensor data. Sensor data may include current sensor data (e.g., current sensor data 146 of FIG. 1), golden run sensor data (sensor data generated during an acceptable manufacturing process, e.g., golden run sensor data 148 of FIG. 1), and simulated sensor data (generated by a physics-based model, e.g. simulated sensor data 162 of FIG. 1). In some embodiments, the manufacturing chamber may be equipped with multiple pressure sensors. In some embodiments, sensor data indicative of the position of a pressure control device, e.g., an actuator, is included. In some embodiments, sensors measuring property values which have a high degree of correlation, such as RF match property values, are included. In some embodiments, data from some sensors is extracted to be used in method 400D. In some embodiments, only a subset of the data from the selected sensors is used. For instance, steady state data may be extracted from trace data in some embodiments. Additionally, data may be extracted that is associated with particular operations of a recipe, for instance operations that are long enough to reach steady state, operations where RF plasma is used, etc.

At block 432, a determination is made on whether there are any significant differences between the various sets of sensor data. Significant, in this context, may indicate a magnitude of difference larger than a threshold value. If data associated with each sensor is within tolerance across the provided data sets, the wafer run may be considered successful and flow returns to block 430, where different sensor data may be provided associated with the next manufacturing run. If a difference is detected, the method proceeds to block 434. In some embodiments, at block 432 processing logic may compare simulated actuator position data to measured actuator position data.

At block 434, more specific sensor differences are investigated to aid in identifying components contributing to the at least one significant difference detected between two sets of sensor data. In some embodiments, measurements from two pressure sensors (e.g., manometers) associated with the manufacturing chamber are compared. In some embodiments, measurements from a sensor associated with the manufacturing chamber measuring an RF match property value and a value from the same sensor from the golden run data may be compared. In some embodiments, the RF match property value may be voltage, current, or capacitor position. In some embodiments, a combination may be monitored and compared. In some embodiments, if both conditions are met, i.e. if the two pressure sensors do not agree and golden run RF match data does not agree with current RF match sensor data, a fault in a pressure sensor is probable. Method 400D proceeds to block 436. If both conditions are not met, an actuator fault is probable. Method 400D proceeds to block 446.

Following method 400D as though a sensor fault is predicted, at block 436 a sensor offset estimation algorithm is performed for recipe operations for which sensor data is available. Possible conditions and patterns of sensor data to be used in method 400D are discussed in connection with block 430 above. The algorithm may take into account sensor data of various sensors from the sensor data sets, previous calculated offsets, etc. and estimate an appropriate offset or offset function for at least one sensor. If sensor offset is consistent across recipe operations, it may be concluded that a sensor offset is the cause of differences between sensor data sets, and method 400D ends at block 438. A corrective action may then be taken in view of the sensor offset, including updating an offset table, adjusting a recipe operation, scheduling maintenance, etc. If sensor offset is not consistent, method 400D proceeds to block 440.

At block 440, processing logic executes a sensor gain estimation algorithm. The sensor gain estimation algorithm may include similar features to the sensor offset estimation algorithm discussed in connection with block 436. If sensor gain is consistent across recipe operations, a fault associated with sensor gain is probable. Method 400D then ends at block 442. A corrective action may be taken in view of the sensor gain fault. If sensor gain is not consistent across recipe operations, a combination of faults may be probable, and method 400D ends at block 444. Further processing may be performed to determine which combination of components is responsible for any differences between sensor data sets, and corrective actions may be taken in view of the combination of components.

Returning to block 434, in some embodiments if significant differences are not detected in pressure sensor data and RF match data, method 400D continues to block 446. At block 436, an actuator offset algorithm is performed for recipe operations for which sensor data is available. The algorithm may take into account sensor data of various sensors, different sensor data sets (e.g., simulated, golden run, etc.), previously calculated offsets, etc., and estimate an appropriate offset or offset function for at least one actuator. If the actuator offset is consistent across recipe operations, it may be concluded that an actuator offset is the cause of differences between sensor data sets, and method 400D ends at block 448. A corrective action may then be taken in view of the actuator offset, including updating an offset table, adjusting a recipe operation, scheduling maintenance, etc. If actuator offset is not consistent, method 400D continues to block 450.

At block 450, processing logic executes an actuator gain estimation algorithm. The actuator gain estimation algorithm may include similar features to the actuator offset estimation algorithm. If actuator gain is consistent across recipe operations, a fault associated with actuator gain is probable. Method 400D then ends at block 452. A corrective action may be taken in view of the actuator gain fault. If actuator gain is not consistent across recipe operations, a combination of faults may be probable, and method 400D ends at block 444. Further processing may be performed to determine which combination of components is responsible for any differences between sensor data sets. In some embodiments, a trained machine learning model may be provided with data indicative of sensor data. A machine learning model may be provided with data at many different stages of method 400D. For instance, each end point of method 400D may correspond to a separate trained machine learning model which is provided data when method 400D reaches that end point. In another embodiment, sensor data may be provided to a trained machine learning model at a time corresponding to an earlier block in FIG. 4D, and the trained machine learning model may carry out some or all of the components of method 400D. Method 400D is one example of a data flow that can provide information about which components are responsible for a difference in sensor data associated with a manufacturing run. Determining differences between sensors indicative of other property values at other points in the method may allow for similar information to be concluded. Such variations are within the scope of this disclosure.

Figure 5:
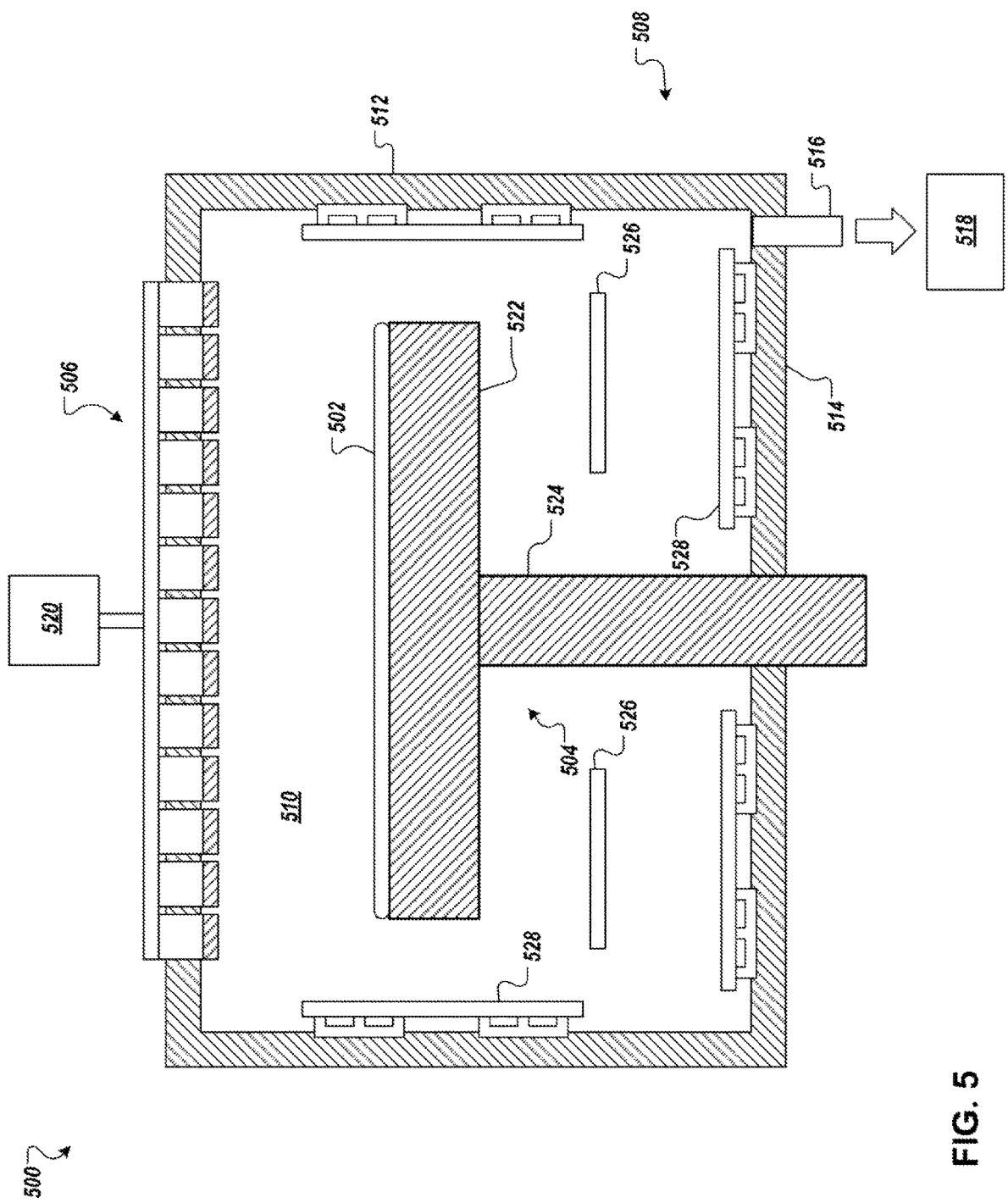
FIG. 5 depicts a sectional view of a manufacturing chamber, according to certain embodiments.

FIG. 5 depicts a sectional view of a manufacturing chamber 500 (e.g., a semiconductor wafer manufacturing chamber) according to some aspects of this disclosure. Manufacturing chamber 500 may be one or more of an etch chamber (e.g., a plasma etch chamber), deposition chamber (including atomic layer deposition, chemical vapor deposition, physical vapor deposition, or plasma enhanced versions thereof), anneal chamber, or the like. For example, manufacturing chamber 500 may be a chamber for a plasma etcher, a plasma cleaner, and so forth. Examples of chamber components may include a substrate support assembly 504, an electrostatic chuck, a ring (e.g., a process kit ring), a chamber wall, a base, a showerhead 506, a gas distribution plate, a liner, a liner kit, a shield, a plasma screen, a flow equalizer, a cooling base, a chamber viewport, a chamber lid, a nozzle and so on.

In one embodiment, manufacturing chamber 500 includes a chamber body 508 and a showerhead 506 that enclose an interior volume 510. In some chambers, showerhead 506 may be replaced by a lid and a nozzle. Chamber body 508 may be constructed from aluminum, stainless steel, or other suitable material. Chamber body 508 generally includes sidewalls 512 and a bottom 514.

An exhaust port 516 may be defined in chamber body 508, and may couple interior volume 510 to a pump system 518. Pump system 518 may include one or more pumps and valves utilized to evacuate and regulate the pressure of interior volume 510 of manufacturing chamber 500. An actuator to control gas flow out the chamber and/or pressure in the chamber may be disposed at or near exhaust port 516.

Showerhead 506 may be supported on sidewalls 512 of chamber body 508 or on a top portion of the chamber body. Showerhead 506 (or the lid, in some embodiments) may be opened to allow access to interior volume 510 of manufacturing chamber 500, and may provide a seal for manufacturing chamber 500 while closed. Gas panel 520 may be coupled to manufacturing chamber 500 to provide process or cleaning gases to interior volume 510 through showerhead 506 (or lid and nozzle). Showerhead 506 may include multiple gas delivery holes throughout. Examples of processing gases that may be used to process substrates in manufacturing chamber 500 include halogen-containing gases, such as $C_2F_6$, $SF_6$, $SiCl_4$, HBr, $NF_3$, $CF_4$, $CHF_3$, $F_2$, $Cl_2$, $CCl_4$, $BCl_3$, and $SiF_4$, among others, and other gases such as $O_2$ or $N_2O$. Examples of carrier gases include $N_2$, He, Ar, and other gases inert to process gases (e.g., non-reactive gases).

Substrate support assembly 504 is disposed in interior volume 510 of manufacturing chamber 500 below showerhead 506. In some embodiments, substrate support assembly 504 includes a susceptor 522 and shaft 524. Substrate support assembly 504 supports a substrate during processing. In some embodiments, also disposed within manufacturing chamber 500 are one or more heaters 526 and reflectors 528.

In some embodiments, showerhead 506 is configured to produce plasma via RF discharge. Maximum power delivery depends on matching impedance between the RF source and the plasma. Impedance matching may be performed by a closed loop control system. Sensors measuring properties related to the RF impedance matching (RF match) may be monitored. Impedance within manufacturing chamber 500 is highly correlated with chamber pressure. Monitoring properties related to RF impedance matching (e.g., RF match voltage, RF match current, RF match capacitor position) may provide insight into the pressure inside manufacturing chamber 500.

Additional sensors are used to measure additional property values in manufacturing chamber 500. Sensors associated with manufacturing chamber 500 may include temperature sensors, pressure sensors (in some embodiments, at least two pressure sensors may be present), flow sensors, etc. Utilizing a physics-based digital twin model of manufacturing chamber 500, failing components can be identified and corrective actions taken.

In one embodiment of the disclosure, the chamber includes two pressure sensors (one of which is in a closed pressure control loop, the other measuring conditions in the chamber), a sensor measuring the position of an actuator regulating chamber pressure, and a sensor measuring voltage used to achieve RF impedance matching. With this arrangement of sensors, patterns in sensor measurements are indicative of manufacturing chamber component faults. For example, an unexpected (e.g., different from simulated data or golden run data) value of actuator position may be caused by several components. Empirically discovering the cause may be expensive. However, if the readings of the free pressure sensor and the RF match voltage sensor are consistent with simulated data and/or golden run data, it's likely that the actuator is operating unexpectedly, but chamber pressure is set correctly. The actuator may be operating in an unexpected way due to deposition, wear, damage, or the like, and scheduling actuator maintenance may be prudent. This and other situations may be understood using simulated sensor data generated by a trained physics-based model.

Figure 6:
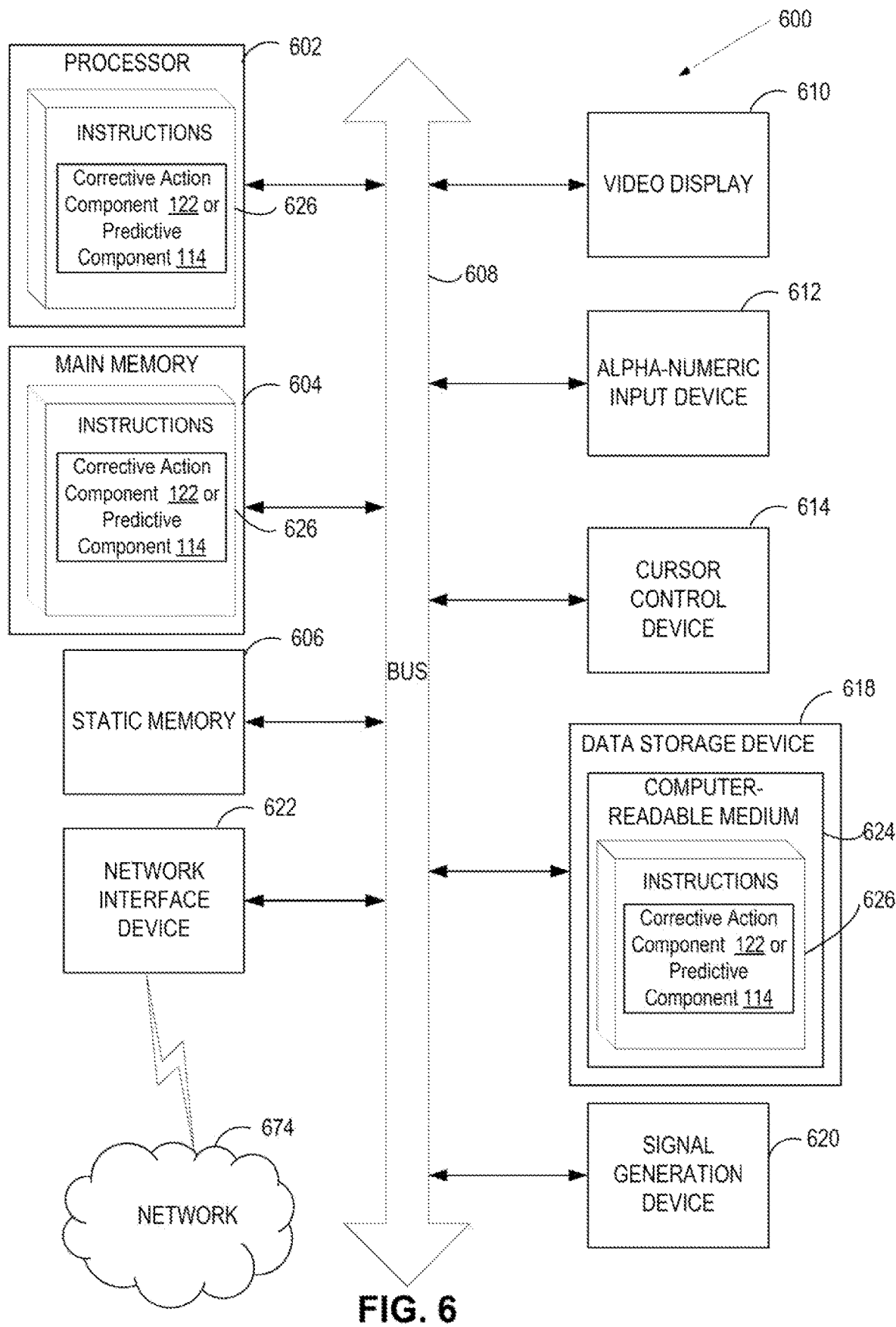
FIG. 6 is a block diagram illustrating a computer system, according to certain embodiments.

FIG. 6 is a block diagram illustrating a computer system 600, according to certain embodiments. In some embodiments, computer system 600 may be connected (e.g., via a network, such as a Local Area Network (LAN), an intranet, an extranet, or the Internet) to other computer systems. Computer system 600 may operate in the capacity of a server or a client computer in a client-server environment, or as a peer computer in a peer-to-peer or distributed network environment. Computer system 600 may be provided by a personal computer (PC), a tablet PC, a Set-Top Box (STB), a Personal Digital Assistant (PDA), a cellular telephone, a web appliance, a server, a network router, switch or bridge, or any device capable of executing a set of instructions (sequential or otherwise) that specify actions to be taken by that device. Further, the term "computer" shall include any collection of computers that individually or jointly execute a set (or multiple sets) of instructions to perform any one or more of the methods described herein.

In a further aspect, the computer system 600 may include a processing device 602, a volatile memory 604 (e.g., Random Access Memory (RAM)), a non-volatile memory 606 (e.g., Read-Only Memory (ROM) or Electrically-Erasable Programmable ROM (EEPROM)), and a data storage device 618, which may communicate with each other via a bus 608.

Processing device 602 may be provided by one or more processors such as a general purpose processor (such as, for example, a Complex Instruction Set Computing (CISC) microprocessor, a Reduced Instruction Set Computing (RISC) microprocessor, a Very Long Instruction Word (VLIW) microprocessor, a microprocessor implementing other types of instruction sets, or a microprocessor implementing a combination of types of instruction sets) or a specialized processor (such as, for example, an Application Specific Integrated Circuit (ASIC), a Field Programmable Gate Array (FPGA), a Digital Signal Processor (DSP), or a network processor).

Computer system 600 may further include a network interface device 622 (e.g., coupled to network 674). Computer system 600 also may include a video display unit 610 (e.g., an LCD), an alphanumeric input device 612 (e.g., a keyboard), a cursor control device 614 (e.g., a mouse), and a signal generation device 620.

In some embodiments, data storage device 618 may include a non-transitory computer-readable storage medium 624 (e.g., non-transitory machine-readable medium) on which may store instructions 626 encoding any one or more of the methods or functions described herein, including instructions encoding components of FIG. 1 (e.g., predictive component 114, corrective action component 122, model 190, etc.) and for implementing methods described herein.

Instructions 626 may also reside, completely or partially, within volatile memory 604 and/or within processing device 602 during execution thereof by computer system 600, hence, volatile memory 604 and processing device 602 may also constitute machine-readable storage media.

While computer-readable storage medium 624 is shown in the illustrative examples as a single medium, the term "computer-readable storage medium" shall include a single medium or multiple media (e.g., a centralized or distributed database, and/or associated caches and servers) that store the one or more sets of executable instructions. The term "computer-readable storage medium" shall also include any tangible medium that is capable of storing or encoding a set of instructions for execution by a computer that cause the computer to perform any one or more of the methods described herein. The term "computer-readable storage medium" shall include, but not be limited to, solid-state memories, optical media, and magnetic media.

The methods, components, and features described herein may be implemented by discrete hardware components or may be integrated in the functionality of other hardware components such as ASICS, FPGAs, DSPs or similar devices. In addition, the methods, components, and features may be implemented by firmware modules or functional circuitry within hardware devices. Further, the methods, components, and features may be implemented in any combination of hardware devices and computer program components, or in computer programs.

Unless specifically stated otherwise, terms such as "receiving," "performing," "providing," "obtaining," "causing," "accessing," "determining," "adding," "using," "training," "reducing," "generating," "correcting," or the like, refer to actions and processes performed or implemented by computer systems that manipulates and transforms data represented as physical (electronic) quantities within the computer system registers and memories into other data similarly represented as physical quantities within the computer system memories or registers or other such information storage, transmission or display devices. Also, the terms "first," "second," "third," "fourth," etc. as used herein are meant as labels to distinguish among different elements and may not have an ordinal meaning according to their numerical designation.

Examples described herein also relate to an apparatus for performing the methods described herein. This apparatus may be specially constructed for performing the methods described herein, or it may include a general purpose computer system selectively programmed by a computer program stored in the computer system. Such a computer program may be stored in a computer-readable tangible storage medium.

The methods and illustrative examples described herein are not inherently related to any particular computer or other apparatus. Various general purpose systems may be used in accordance with the teachings described herein, or it may prove convenient to construct more specialized apparatus to perform methods described herein and/or each of their individual functions, routines, subroutines, or operations. Examples of the structure for a variety of these systems are set forth in the description above.

The above description is intended to be illustrative, and not restrictive. Although the present disclosure has been described with references to specific illustrative examples and embodiments, it will be recognized that the present disclosure is not limited to the examples and embodiments described. The scope of the disclosure should be determined with reference to the following claims, along with the full scope of equivalents to which the claims are entitled.

What is claimed is:

1. A method, comprising:
   receiving first sensor data, generated during a manufacturing process by sensors associated with a substrate manufacturing chamber;
   receiving simulated sensor data generated by a trained physics-based model;
   determining that an actuator of the substrate manufacturing chamber contributes to a difference between the first sensor data and the simulated sensor data, by determining that a difference between first data indicative of chamber pressure and second data indicative of chamber pressure is less than a first threshold value; and
   causing performance of a corrective action in view of the difference between the first sensor data and the simulated sensor data.

2. The method of claim 1, wherein the corrective action comprises at least one of:
   updating an offset table;
   scheduling maintenance; or
   updating a manufacturing recipe.

3. The method of claim 2, wherein the offset table comprises one or more of pressure sensor offset values or offset values for an actuator used to control pressure in the substrate manufacturing chamber.

4. The method of claim 1, further comprising:
   receiving second sensor data associated with an instance of a manufacturing process wherein acceptable chamber conditions were achieved; and
   determining which components of the substrate manufacturing chamber contribute to a difference between the first sensor data and the second sensor data.

5. The method of claim 1, wherein the substrate manufacturing chamber comprises two pressure sensors, a first pressure sensor and a second pressure sensor, the first pressure sensor being part of a pressure control loop, and the second pressure sensor not being part of the pressure control loop.

6. The method of claim 1, wherein the first sensor data comprises one or more of:
   pressure sensor data;
   data indicative of a position of an actuator;
   radio frequency (RF) match voltage data;
   RF match current data; or
   RF match capacitor position data.

7. The method of claim 1, wherein the physics-based model comprises a physics-based digital twin model, wherein the physics-based digital twin model calculates gas conductance through the substrate manufacturing chamber.

8. The method of claim 1, further comprising determining a pressure sensor contribution to the difference between the first sensor data and the simulated sensor data by comparing third data indicative of chamber pressure and fourth data indicative of chamber pressure, and finding a difference between the third data and the fourth data to be more than a threshold value from zero.

9. The method of claim 1, wherein determining which one or more components of the substrate manufacturing chamber contribute to the difference between the first sensor data and the simulated sensor data comprises providing the first sensor data and the simulated sensor data to a trained machine learning model, wherein the trained machine learning model outputs, for each component of the one or more components, an estimated contribution of the component to the difference between the first sensor data and the simulated sensor data.

10. The method of claim 1, wherein the sensors associated with the substrate manufacturing chamber that generate the first sensor data are one or more pressure sensors.

11. The method of claim 1, wherein the first data indicative of chamber pressure comprises the first sensor data.

12. A method, comprising:
    receiving first sensor data generated during a manufacturing process by sensors associated with substrate manufacturing equipment;
    receiving first simulated sensor data generated by a physics-based model;
    determining at least one difference between the first sensor data and the simulated sensor data; and
    training the physics-based model by adjusting parameters associated with the physics-based model until the at least one difference between the first sensor data and the simulated sensor data is less than a threshold value, wherein the physics-based model is to provide second simulated sensor data to an analysis module configured to determine that an actuator contributes to one or more differences between the second simulated sensor data and second sensor data.

13. The method of claim 12, further comprising:
receiving, from the trained physics-based model, third simulated sensor data;
receiving, from sensors associated with the substrate manufacturing equipment, third sensor data;
determining which one or more components of the substrate manufacturing chamber contribute to a difference between the third sensor data and the third simulated data; and
causing performance of a corrective action in view of the difference.

14. The method of claim 12, wherein the first sensor data generated by the physics-based model comprises pressure sensor data and position data for an actuator used to control pressure in the substrate manufacturing chamber.

15. The method of claim 12, wherein the physics-based model comprises a physics-based digital twin model, wherein the physics-based digital twin model calculates gas conductance through the substrate manufacturing chamber.

16. The method of claim 12, wherein:
one or more components of the substrate manufacturing chamber which contribute to a difference between the second sensor data and the second simulated data comprise one or more pressure sensors and one or more actuators; and
determining an actuator contribution comprises comparing first data indicative of chamber pressure and second data indicative of chamber pressure, and finding the difference to be within a threshold value of zero.

17. The method of claim 16 wherein the first and second data indicative of chamber pressure comprises one or more of:
sensor data; or
simulated sensor data, wherein the sensor data or simulated sensor data comprises one or more of:
pressure sensor data;
data indicative of a position of an actuator;
radio frequency (RF) match voltage data;
RF match current data; or
RF match capacitor position data.

18. A non-transitory computer-readable storage medium storing instructions that, when executed by a processing device, cause the processing device to perform operations comprising:
receiving first sensor data, generated during a manufacturing process by sensors associated with a substrate manufacturing chamber;
receiving simulated sensor data generated by a trained physics-based model;
determining that an actuator of the substrate manufacturing chamber contributes to a difference between the first sensor data and the simulated sensor data, by determining that a difference between first data indicative of chamber pressure and second data indicative of chamber pressure is less than a first threshold value from zero; and
causing performance of a corrective action in view of the difference between the first sensor data and the simulated sensor data.

19. The non-transitory computer-readable storage medium of claim 18, wherein the operations further comprise:
storing second sensor data associated with an instance of a manufacturing process wherein acceptable chamber conditions were achieved; and
determining which components of the manufacturing chamber contribute to a difference between the first sensor data and the second sensor data.

20. The non-transitory computer-readable storage medium of claim 18, wherein determining which one or more components of the manufacturing chamber contribute to the difference between the first sensor data and the simulated sensor data comprises providing the first sensor data and the simulated sensor data to a trained machine learning model, wherein the trained machine learning model is configured to predict the contribution from each of a plurality of components of the manufacturing chamber to the difference between the first sensor data and the simulated sensor data.

* * * * *